US012563902B2

(12) United States Patent
Yoon et al.

(10) Patent No.: US 12,563,902 B2
(45) Date of Patent: Feb. 24, 2026

(54) DISPLAY APPARATUS AND METHOD OF MANUFACTURING THE SAME

(71) Applicant: Samsung Display Co., Ltd., Yongin-si (KR)

(72) Inventors: Youngsoo Yoon, Yongin-si (KR); Yunkyeong In, Yongin-si (KR); Hyunji Cha, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 116 days.

(21) Appl. No.: 17/206,735

(22) Filed: Mar. 19, 2021

(65) Prior Publication Data

US 2021/0359047 A1      Nov. 18, 2021

(30) Foreign Application Priority Data

May 18, 2020    (KR) ........................ 10-2020-0059330

(51) Int. Cl.
| | |
|---|---|
| *H01L 27/32* | (2006.01) |
| *H10K 59/122* | (2023.01) |
| *H10K 59/124* | (2023.01) |
| *H10K 59/35* | (2023.01) |
| *H10K 59/12* | (2023.01) |
| *H10K 59/38* | (2023.01) |
| *H10K 71/00* | (2023.01) |

(52) U.S. Cl.
CPC ......... *H10K 59/122* (2023.02); *H10K 59/124* (2023.02); *H10K 59/353* (2023.02); *H10K 59/1201* (2023.02); *H10K 59/38* (2023.02); *H10K 71/00* (2023.02)

(58) Field of Classification Search
CPC ............. H01L 27/3246; H01L 27/3218; H01L 27/3258; H01L 51/56; H01L 27/3227; H01L 2227/323; H10K 59/122; H10K 59/124
USPC ........................................................ 257/88
See application file for complete search history.

(56) References Cited

U.S. PATENT DOCUMENTS

| | | | |
|---|---|---|---|
| 8,946,687 | B2 | 2/2015 | Kim et al. |
| 9,214,503 | B2 | 12/2015 | So et al. |

(Continued)

FOREIGN PATENT DOCUMENTS

| | | |
|---|---|---|
| KR | 10-2013-0007006 A | 1/2013 |
| KR | 10-2015-0018941 A | 2/2015 |

(Continued)

*Primary Examiner* — Dzung Tran
(74) *Attorney, Agent, or Firm* — Womble Bond Dickinson (US) LLP

(57) ABSTRACT

A display device includes: a substrate including a display area and a component area; a first pixel group on the display area; a second pixel group and a transmission area on the component area; an organic insulating layer on the substrate and including an opening corresponding to the transmission area; a display element on the organic insulating layer and including a pixel electrode and an opposite electrode; and a pixel-defining layer covering edges of the pixel electrode and defining an emission area of the display element, wherein the organic insulating layer includes a planarization area and a reduction area on the component area, the reduction area having a thickness that decreases in a direction from the planarization area to the opening, and a portion of the pixel-defining layer is on the reduction area.

13 Claims, 22 Drawing Sheets

(56)　　　　　　　References Cited

U.S. PATENT DOCUMENTS

| 9,893,134 | B2 | 2/2018 | You et al. | |
| 9,947,734 | B2 | 4/2018 | You et al. | |
| 10,964,908 | B2 | 3/2021 | Nam et al. | |
| 2011/0204369 | A1* | 8/2011 | Ha | H01L 27/3276 |
| | | | | 257/59 |
| 2014/0306941 | A1* | 10/2014 | Kim | H10K 59/131 |
| | | | | 345/204 |
| 2016/0064461 | A1* | 3/2016 | Lee | H01L 27/3246 |
| | | | | 257/40 |
| 2016/0111487 | A1* | 4/2016 | Jeong | H01L 27/326 |
| | | | | 257/40 |
| 2016/0190389 | A1* | 6/2016 | Lee | A61B 5/0075 |
| | | | | 438/28 |
| 2017/0148856 | A1* | 5/2017 | Choi | H01L 27/3258 |
| 2017/0294425 | A1* | 10/2017 | Kim | H01L 51/5253 |
| 2017/0309651 | A1* | 10/2017 | Kim | G02F 1/133305 |
| 2018/0233551 | A1* | 8/2018 | Choi | H01L 27/3276 |
| 2018/0315809 | A1* | 11/2018 | Kim | H01L 27/1218 |
| 2019/0148672 | A1* | 5/2019 | Seo | H01L 51/5271 |
| | | | | 257/40 |
| 2019/0393444 | A1* | 12/2019 | Nam | H10K 59/1213 |
| 2020/0152842 | A1* | 5/2020 | Park | H10H 29/10 |

FOREIGN PATENT DOCUMENTS

| KR | 10-2016-0139115 | A | 12/2016 |
| KR | 10-1703876 | B1 | 2/2017 |
| KR | 10-2017-0078909 | A | 7/2017 |
| KR | 10-2018-0049296 | A | 5/2018 |
| KR | 10-2020-0000521 | A | 1/2020 |

* cited by examiner

DISPLAY APPARATUS AND METHOD OF MANUFACTURING THE SAME

CROSS-REFERENCE TO RELATED APPLICATION

The present application claims priority to and the benefit of Korean Patent Application No. 10-2020-0059330, filed on May 18, 2020, in the Korean Intellectual Property Office, the entire disclosure of which is incorporated herein by reference.

BACKGROUND

1. Field

Aspects of one or more example embodiments relate to a display apparatus and a method of manufacturing a display apparatus.

2. Description of Related Art

Recently, the various uses and applications of display apparatuses has become more diversified. In addition, as display apparatuses have become thinner and lighter, their ranges of use have gradually expanded.

As the area occupied by a display area in display apparatuses expands, various functions that are combined or associated with the display apparatuses have been added. In order to add various functions while expanding the display area, research has been carried out on display apparatuses including a component area in which the various functions are performed while displaying an image.

A transmission portion may be arranged on the component area together with display elements, and the transmission portion may include openings of insulating layers stacked in the display apparatus to secure light transmittance. For example, the display apparatus may include an inorganic insulating layer and an organic insulating layer on the inorganic insulating layer. The inorganic insulating layer and the organic insulating layer may respectively include openings corresponding to the transmission portion.

Organic light-emitting display apparatuses generally include an organic light-emitting diode as a display element, the organic light-emitting diode including an opposite electrode, a pixel electrode, and an emission layer. The organic light-emitting diode may be arranged in a display area and a component area, an image being displayed on the display area. In this case, the edges of the pixel electrode may be covered by a pixel-defining layer. The pixel-defining layer may define an emission area of the organic light-emitting diode.

The above information disclosed in this Background section is only for enhancement of understanding of the background and therefore the information discussed in this Background section does not necessarily constitute prior art.

SUMMARY

Aspects of one or more embodiments include a display apparatus, wherein a pixel-defining layer is configured to define an emission area of an organic light-emitting diode while a transmittance of a transmission portion is secured, and a method of manufacturing the display apparatus.

Additional aspects will be set forth in part in the description which follows and, in part, will be apparent from the description, or may be learned by practice of the presented embodiments of the disclosure.

According to one or more example embodiments, a display apparatus includes a substrate including a display area and a component area, a first pixel group being arranged on the display area, and a second pixel group and a transmission portion being arranged on the component area, an organic insulating layer arranged on the substrate and including an opening corresponding to the transmission portion, a display element arranged on the organic insulating layer and including a pixel electrode and an opposite electrode, and a pixel-defining layer covering edges of the pixel electrode and defining an emission area of the display element, wherein the organic insulating layer includes a planarization area and a reduction area on the component area, the reduction area having a thickness that decreases in a direction from the planarization area to the opening, and a portion of the pixel-defining layer is arranged on the reduction area.

According to some example embodiments, a first thickness of the pixel-defining layer arranged on the reduction area may be less than a second thickness of the pixel-defining layer arranged on the planarization area.

According to some example embodiments, the display apparatus may further include a spacer arranged on the pixel-defining layer corresponding to the display area, wherein a first distance from a top surface of the substrate to a top surface of the spacer may be greater than a second distance from the top surface of the substrate to a top surface of the pixel-defining layer arranged on the planarization area.

According to some example embodiments, the second distance may be greater than a third distance from the top surface of the substrate to a top surface of the pixel-defining layer arranged in display area.

According to some example embodiments, the spacer and the pixel-defining layer may include the same material.

According to some example embodiments, the display apparatus may further include an inorganic insulating layer between the substrate and the organic insulating layer, wherein the inorganic insulating layer may include an insulating layer opening corresponding to the transmission portion.

According to some example embodiments, the organic insulating layer may include a first organic insulating layer and a second organic insulating layer, the first organic insulating layer being on the inorganic insulating layer, and the second organic insulating layer being on the first inorganic insulating layer, wherein the first organic insulating layer may include a first opening corresponding to the transmission portion.

According to some example embodiments, a size of the first opening may be less than a size of the insulating layer opening, and the first organic insulating layer may cover an inner surface of the insulating layer opening.

According to some example embodiments, a size of the first opening may be greater than a size of the insulating layer opening, and the first opening may expose a portion of the inorganic insulating layer.

According to some example embodiments, the display element may number two or more, the transmission portion may surround the second pixel group, the second pixel group may include a plurality of auxiliary sub-pixels implemented by the display elements, and the plurality of auxiliary sub-pixels may be symmetric with respect to a center of the second pixel group.

According to some example embodiments, one of the plurality of auxiliary sub-pixels may have a quadrangular shape in a plan view and another of the plurality of auxiliary sub-pixels may have a pentagonal shape in a plan view.

According to one or more example embodiments, a method of manufacturing a display apparatus includes forming an organic insulating layer on a substrate including a display area and a component area, a first pixel group being arranged on the display area, and a second pixel group and a transmission portion being arranged on the component area, forming a pixel electrode on the organic insulating layer, and forming a pixel-defining layer covering edges of the pixel electrode on the display area and the component area, wherein the forming of the organic insulating layer may include forming a planarization area and forming a reduction area on the component area, the reduction area having a thickness that decreases in a direction from the planarization area to the transmission portion, and the forming of the pixel-defining layer may include forming a portion of the pixel-defining layer on the reduction area.

According to some example embodiments, the method may further include forming a spacer on the pixel-defining layer corresponding to the display area, wherein, while the spacer is formed on the display area, the pixel-defining layer may be formed on the component area.

According to some example embodiments, the method may further include forming a portion of the pixel-defining layer on the planarization area, wherein a first distance from a top surface of the substrate to a top surface of the spacer may be greater than a second distance from the top surface of the substrate to a top surface of the pixel-defining layer arranged on the planarization area, and the second distance may be greater than a third distance from the top surface of the substrate to a top surface of the pixel-defining layer arranged in display area.

According to some example embodiments, the forming of the spacer may include arranging a half-tone mask on the display area, and the forming of the pixel-defining layer may include arranging a full-tone mask on the component area.

According to some example embodiments, the half-tone mask and the full-tone mask may be connected to each other.

According to some example embodiments, the forming of the pixel-defining layer may include forming a preliminary insulating layer on the display area and the component area, and forming the pixel-defining layer by removing at least a portion of the preliminary insulating layer, wherein the preliminary insulating layer may include a groove corresponding to the transmission portion.

According to some example embodiments, the method may further include forming an inorganic insulating layer over the substrate, wherein the inorganic insulating layer may include an insulating layer opening corresponding to the transmission portion.

According to some example embodiments, the forming of the organic insulating layer may further include forming a first organic insulating layer on the inorganic insulating layer, and forming a second organic insulating layer on the first organic insulating layer, wherein the first organic insulating layer may include a first opening corresponding to the transmission portion, and the second organic insulating layer may include a second opening corresponding to the transmission portion.

According to some example embodiments, the first organic insulating layer may cover an inner surface of the insulating layer opening.

According to some example embodiments, the first opening may expose a portion of the inorganic insulating layer.

BRIEF DESCRIPTION OF THE DRAWINGS

The above and other aspects, features, and characteristics of certain example embodiments of the disclosure will be more apparent from the following description taken in conjunction with the accompanying drawings, in which.

DETAILED DESCRIPTION

Figure 1A:
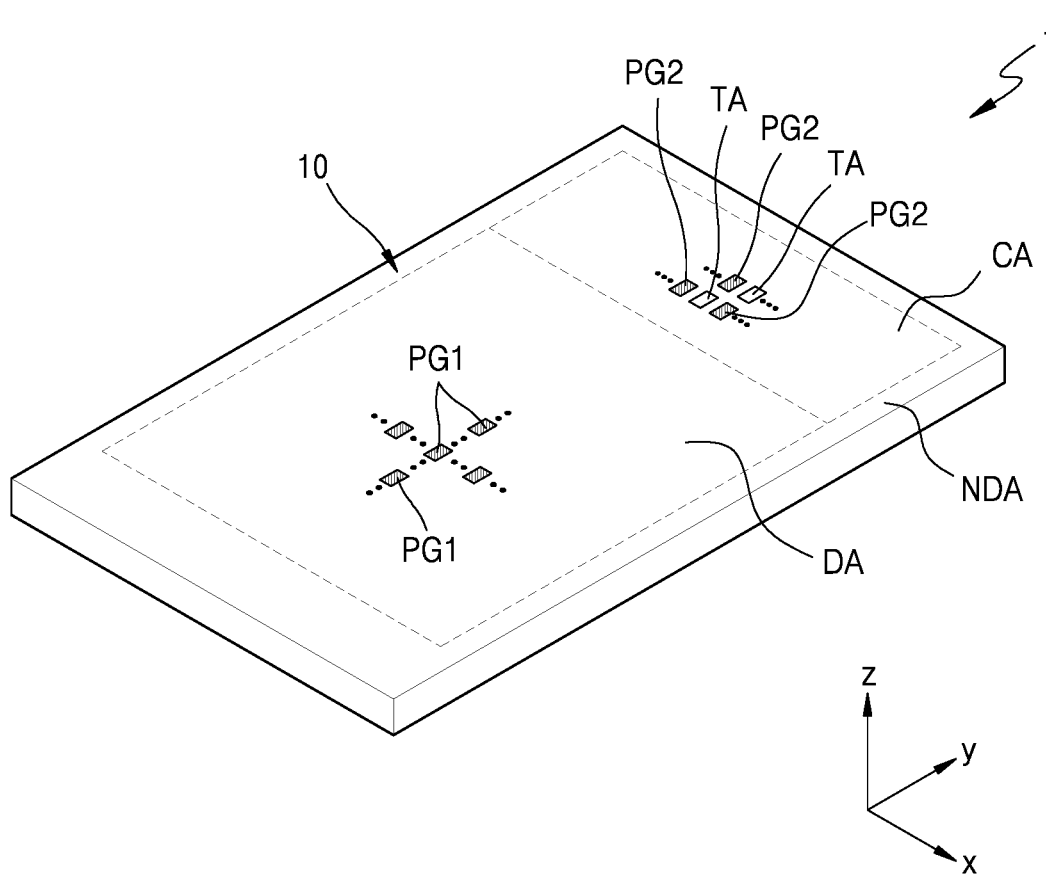
FIG. 1A is a perspective view of a display apparatus according to some example embodiments.

Reference will now be made in more detail to aspects of some example embodiments, which are illustrated in the accompanying drawings, wherein like reference numerals refer to like elements throughout. In this regard, the present example embodiments may have different forms and should not be construed as being limited to the descriptions set forth herein. Accordingly, the example embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the present disclosure allows for various changes and numerous embodiments, aspects of some example embodiments will be illustrated in the drawings and described in more detail in the written description. Effects and characteristics of the present disclosure, and a method of accomplishing the same will become apparent and more readily appreciated from the following description of the embodiments and the accompanying drawings. However, the present disclosure is not limited to embodiments below and may be implemented in various forms.

Hereinafter, aspects of some example embodiments are described in more detail with reference to the accompany drawings. When description is made with reference to the drawings, like reference numerals are given to like or corresponding elements, and some repeated descriptions thereof may be omitted.

It will be understood that although the terms "first," "second," etc. may be used herein to describe various components, these components should not be limited by these terms. These components are only used to distinguish one component from another.

As used herein, the singular forms "a," "an," and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on," another layer, region, or component, it can be directly or indirectly formed on the other layer, region, or component. That is, for example, intervening layers, regions, or components may be present.

Sizes of elements in the drawings may be exaggerated or reduced for convenience of explanation. In other words, because sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

It will be understood that when a layer, region, or component is referred to as being "connected" to another layer, region, or component, it may be "directly connected" to the other layer, region, or component and/or may be "indirectly connected" to the other layer, region, or component with other layer, region, or component interposed therebetween. For example, it will be understood that when a layer, region, or component is referred to as being "electrically connected" to another layer, region, or component, it may be "directly electrically connected" to the other layer, region, or component and/or may be "indirectly electrically connected" to other layer, region, or component with other layer, region, or component interposed therebetween.

A display apparatus 1 is an apparatus displaying an image and may include game consoles, multimedia apparatuses, and portable mobile apparatuses such as ultra-miniaturized personal computers (PC). The display apparatus 1 described below may include liquid crystal displays, electrophoretic displays, organic light-emitting displays, inorganic light-emitting displays, field emission displays, surface-conduction electron-emitter displays, quantum-dot displays, plasma displays, and cathode ray displays. Hereinafter, though an organic light-emitting display apparatus is described as the display apparatus 1 according to some example embodiments as an example, embodiments may employ various display apparatuses described above.

Figure 1B:
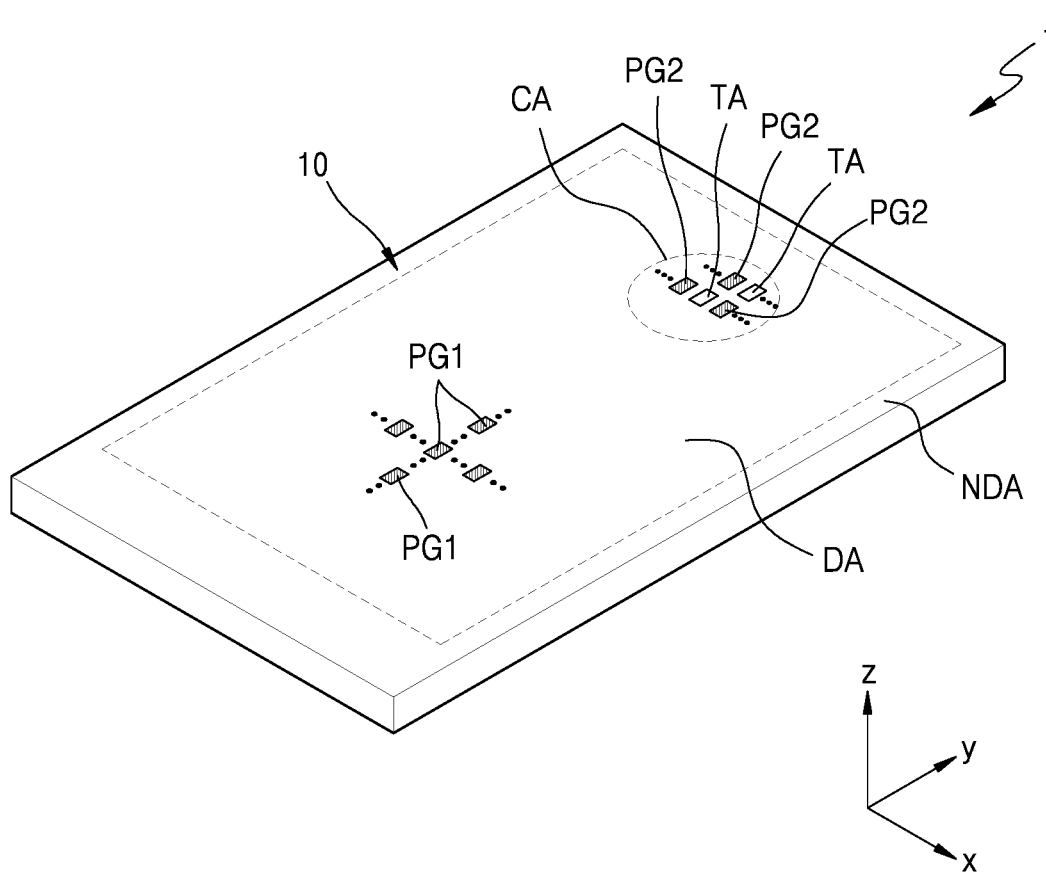
FIG. 1B is a perspective view of a display apparatus according to some example embodiments.

FIG. 1A is a perspective view of the display apparatus 1 according to some example embodiments. FIG. 1B is a perspective view of the display apparatus 1 according to some example embodiments.

Referring to FIG. 1A, the display apparatus 1 may include a display panel 10. The display panel 10 may include a display area DA, a component area CA, and a non-display area NDA.

The display area DA may display an image. A first pixel group PG1 may be arranged on the display area DA. The first pixel group PG1 may include a plurality of display elements, for example, a plurality of organic light-emitting diodes. The display panel 10 may display a first image by using light emitted from the first pixel group PG1.

A component may be arranged in the component area CA with an image displayed in the component area CA. In addition, a second pixel group PG2 and a transmission portion TA may be arranged on the component area CA. As described below with reference to FIG. 2A, the component may include a sensor or a camera (or other signal emitter or receiver) that uses an infrared rays, visible light, sound, or other communication spectrum to transmit and/or receive signals in the component area CA.

According to some example embodiments, the component area CA may be at least partially surrounded by the display area DA. Though it is shown in FIG. 1A that the component area CA is arranged in a bar type on one side of the display area DA, the component area CA may be arranged in a notch type on one side of the display area DA. According to some example embodiments, the component area CA may be variously arranged inside the display area DA.

The transmission portion TA may be arranged on the component area CA, light and/or sound output from the component to the outside or progressing toward the component from the outside passing through the transmission portion TA. A pixel may not be arranged in the transmission portion TA. In the case where an infrared ray passes through the transmission portion TA, an infrared transmittance of the component area CA may be 15% or more, more preferably 20% or more, 25% or more, 85% or more, or 90% or more.

The second pixel group PG2 may be arranged on the component area CA and may display a second image by emitting light. The second pixel group PG2 may include a plurality of display elements, for example, a plurality of organic light-emitting diodes. In this case, the first image and the second image may include a portion of one image (e.g., static or video images) displayed by the display apparatus 1 or the display panel 10. For example, the second pixel group PG2 may display a portion of an image that is collectively displayed by the first pixel group PG1 and the second pixel group PG2, with the second pixel group PG2 displaying the corresponding portion of the image with a different resolution (e.g., a lower resolution). Alternatively, the first image and the second image may include images that are independent from each other.

The non-display area NDA may include a region in which an image is not displayed and thus a pixel group is not arranged in the non-display area NDA. The non-display area NDA may entirely surround the display area DA and the component area CA. A driver, etc. may be arranged in the non-display area NDA, the driver, etc. providing an electric signal or power to the first pixel group PG1 and the second pixel group PG2. The non-display area NDA may include a pad portion which is a region to which an electronic element or a printed circuit board, etc. may be electrically connected.

It is shown in FIG. 1B that the component area CA is entirely surrounded by the display area DA.

According to some example embodiments, the component area CA may have a circular shape or an elliptical shape in a plan view. According to some example embodiments, the component area CA may have a polygonal shape such as a quadrangular shape in a plan view. According to some example embodiments, the component area CA may include a curvature portion. In addition, the position of the component area CA and the number of component areas CA may be variously changed. For example, the display panel 10 may include a plurality of component areas CA.

FIGS. 2A to 2D are cross-sectional views of a portion of the display apparatus 1 according to some example embodiments.

Referring to FIGS. 2A to 2D, the display apparatus 1 may include the display panel 10 and a component COMP overlapping the display panel 10. The display panel 10 may include the component area CA and the display area DA, the component area CA overlapping the component COMP, and a first image being displayed in the display area DA.

The display panel 10 may include a substrate 100, a display layer DISL, a touchscreen layer TSL, an optical functional layer OFL on the substrate 100, and a panel protection member PB under the substrate 100. The display layer DISL may include a pixel circuit layer PCL, a display element layer EDL, and a sealing member ENCM, the pixel circuit layer PCL including a buffer layer 111 and thin film transistors TFTm and TFTa, the display element layer EDL including an organic light-emitting diode, which is a display element, and the sealing member ENCM including a thin-film encapsulation layer TFEL or a sealing substrate ENS.

The display area DA and the component area CA may be defined in the substrate 100. That is, the substrate 100 may include the display area DA and the component area CA. The substrate 100 may include glass or a polymer resin such as polyethersulfone, polyarylate, polyetherimide, polyethylene naphthalate, polyethylene terephthalate, polyphenylene sulfide, polyimide, polycarbonate, and cellulose acetate propionate. The substrate 100 including the polymer resin may be flexible, rollable, and bendable. The substrate 100 may have a multi-layered structure including a base layer and a barrier layer each including the polymer resin.

The buffer layer 111 is arranged on the substrate 100, may reduce or block the penetration of foreign substances, moisture, or external air from below the substrate 100, and provide a flat surface on the substrate 100. The buffer layer 111 may include an inorganic material such as oxide or nitride, an organic material, or an organic/inorganic composite material and include a single layer or a multi-layer including an inorganic material and an organic material. According to some example embodiments, the buffer layer 111 may include silicon oxide ($SiO_x$) or silicon nitride ($SiN_x$).

A main thin film transistor TFTm and a main organic light-emitting diode OLEDm connected thereto may be arranged on the display area DA of the display panel 10 to implement a main sub-pixel Pm. An auxiliary thin film transistor TFTa and an auxiliary organic light-emitting diode OLEDa connected thereto may be arranged on the component area CA of the display panel 10 to implement an auxiliary sub-pixel Pa. The main sub-pixel Pm may be a portion of the first pixel group PG1 of FIG. 1A, and the auxiliary sub-pixel Pa may be a portion of the second pixel group PG2 of FIG. 1A.

The transmission portion TA may be arranged on the component area CA, a display element not being arranged in the transmission portion TA. The transmission portion TA may include a region through which light/signal emitted from the component COMP or light/signal incident to the component COMP passes, the component COMP corresponding to the component area CA.

Figure 2A:
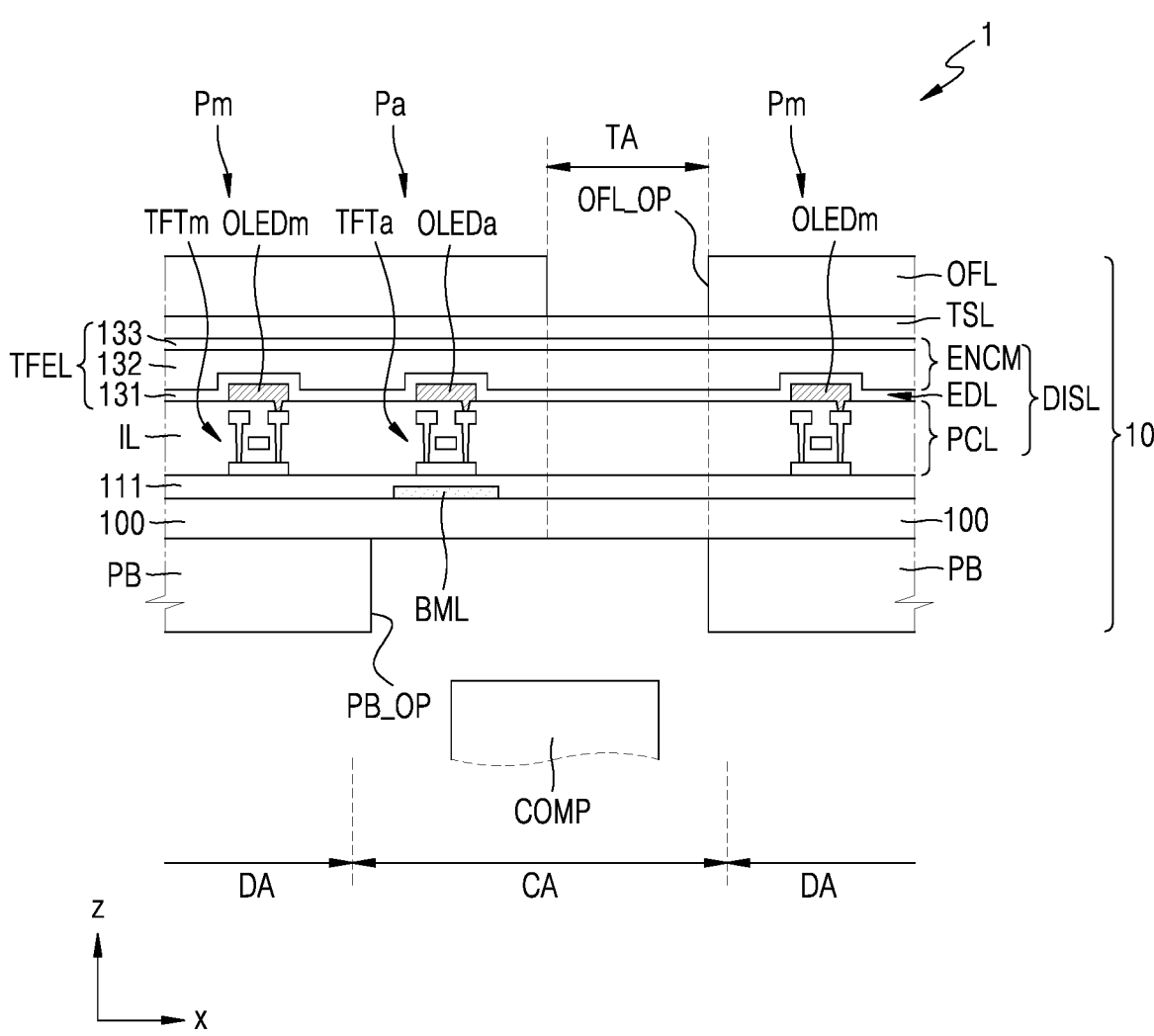
FIGS. 2A to 2D are cross-sectional views of a portion of a display apparatus according to some example embodiments.

A bottom metal layer BML may be arranged on the component area CA. The bottom metal layer BML may be arranged to correspond to below the auxiliary thin film transistor TFTa. The bottom metal layer BML may block external light reaching the auxiliary thin film transistor TFTa. According to some example embodiments, a constant voltage or signal may be applied to the bottom metal layer BML to prevent or reduce the damage to a pixel circuit due to electrostatic discharge. The bottom metal layers BML may be arranged on the component area CA. Depending on the cases, different voltages may be applied to the bottom metal layers BML. One bottom metal layer BML may be arranged on the component area CA, the bottom metal layer BML including a hole corresponding to the transmission portion TA. Though it is shown in FIG. 2A that the bottom metal layer BML is arranged on the substrate 100, the bottom metal layer BML may be inserted into the substrate 100 according to some example embodiments.

The display element layer EDL may be covered by the thin-film encapsulation layer TFEL or covered by the sealing substrate ENS. According to some example embodiments, as shown in FIG. 2A, the thin-film encapsulation layer TFEL may include at least one inorganic encapsulation layer and at least one organic encapsulation layer. According to some example embodiments, the thin-film encapsulation layer TFEL may include a first inorganic encapsulation layer 131, an organic encapsulation layer 132, and a second inorganic encapsulation layer 133.

Figure 2B:
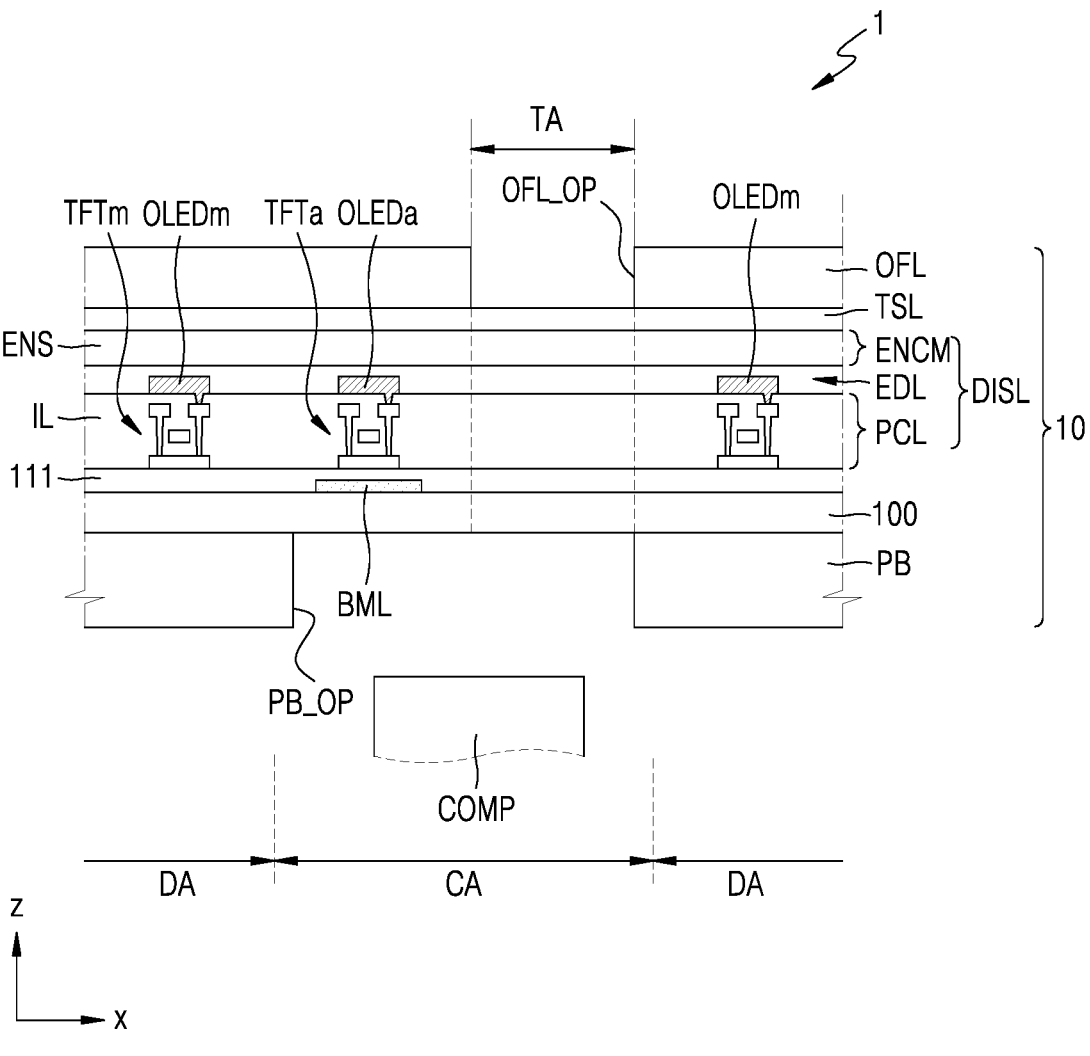

According to some example embodiments, as shown in FIG. 2B, the sealing substrate ENS may face the substrate 100 with the display element layer EDL therebetween. A gap may be present between the sealing substrate ENS and the display element layer EDL. The sealing substrate ENS may include glass. Sealant may be arranged between the substrate 100 and the sealing substrate ENS, the sealant including frit. The sealant may be arranged in the non-display area NDA shown in FIG. 1A. The sealant arranged on the non-display area NDA and surrounding the display area DA may prevent or reduce instances of moisture penetrating into the display area DA. According to some example embodiments, the thin-film encapsulation layer TFEL of FIG. 2A and the sealing substrate ENS of FIG. 2B may be simultaneously employed.

The touchscreen layer TSL may sense an external input, for example, coordinate information corresponding to a touch event. The touchscreen layer TSL may include a touch electrode and touch wirings, the touch wirings being connected to the touch electrode. The touchscreen layer TSL may detect an external input by using a self-capacitive method or a mutual capacitive method.

The touchscreen layer TSL may be formed on the thin-film encapsulation layer TFEL. Alternatively, the touchscreen layer TSL may be separately formed on the touchscreen and then coupled to the thin-film encapsulation layer TFEL through an adhesive layer such as an optically clear adhesive. According to some example embodiments, as shown in FIGS. 2A to 2D, the touchscreen layer TSL may be directly formed right on the thin-film encapsulation layer TFEL. In this case, the adhesive layer may not be arranged between the touchscreen layer TSL and the thin-film encapsulation layer TFEL.

The optical functional layer OFL may include a reflection prevention layer. The reflection prevention layer may reduce light (external light) incident toward the display apparatus 1 from the outside.

According to some example embodiments, the optical functional layer OFL may include a polarizing film. The optical functional layer OFL may include an opening OFL_OP corresponding to the transmission portion TA. Accordingly, a light transmittance of the transmission portion TA may be remarkably improved. A transparent material such as an optically clear resin (OCR) may fill the opening OFL_OP corresponding to the transmission portion TA.

Figure 2C:
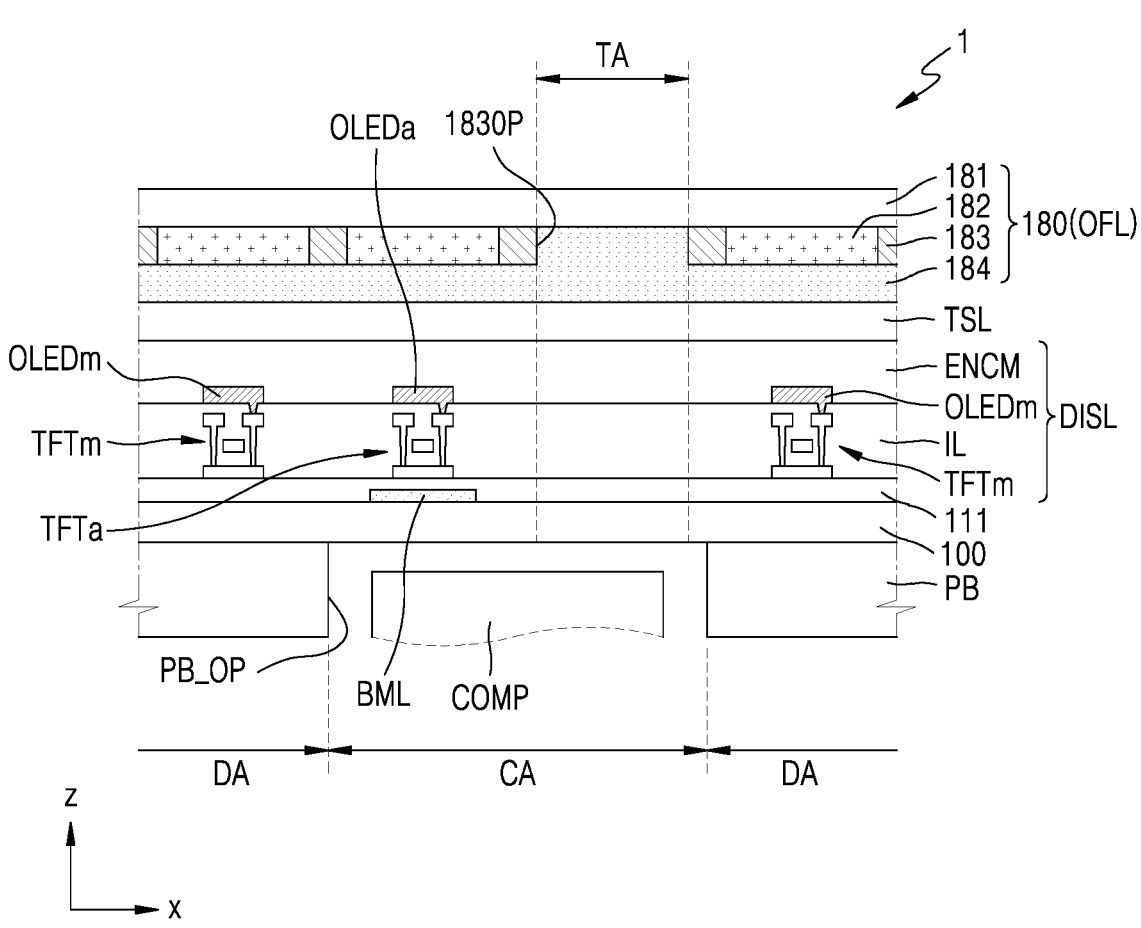

According to some example embodiments, as shown in FIG. 2C, the optical functional layer OFL may include a filter plate 180 including a black matrix and color filters. The filter plate 180 may include a base layer 181, the color filters 182 on the base layer 181, the black matrix 183, and an overcoat layer 184.

The color filters 182 may be arranged by taking into account colors of light emitted from the pixels of the display panel 10. For example, the color filters 182 may have red, green, or blue depending on the color of light emitted from organic light-emitting diodes, that is, a main organic light-emitting diode OLEDm and an auxiliary organic light-emitting diode OLEDa. There is no color filter 182 and no black matrix 183 in the transmission portion TA. For example, a layer including the color filter 182 and the black matrix 183 may include an opening 1830P corresponding to the transmission portion TA. A portion of the overcoat layer 184 may at least partially fill the opening 1830P. The overcoat layer 184 may include an organic material such as a resin and the organic material may be transparent.

Figure 2D:
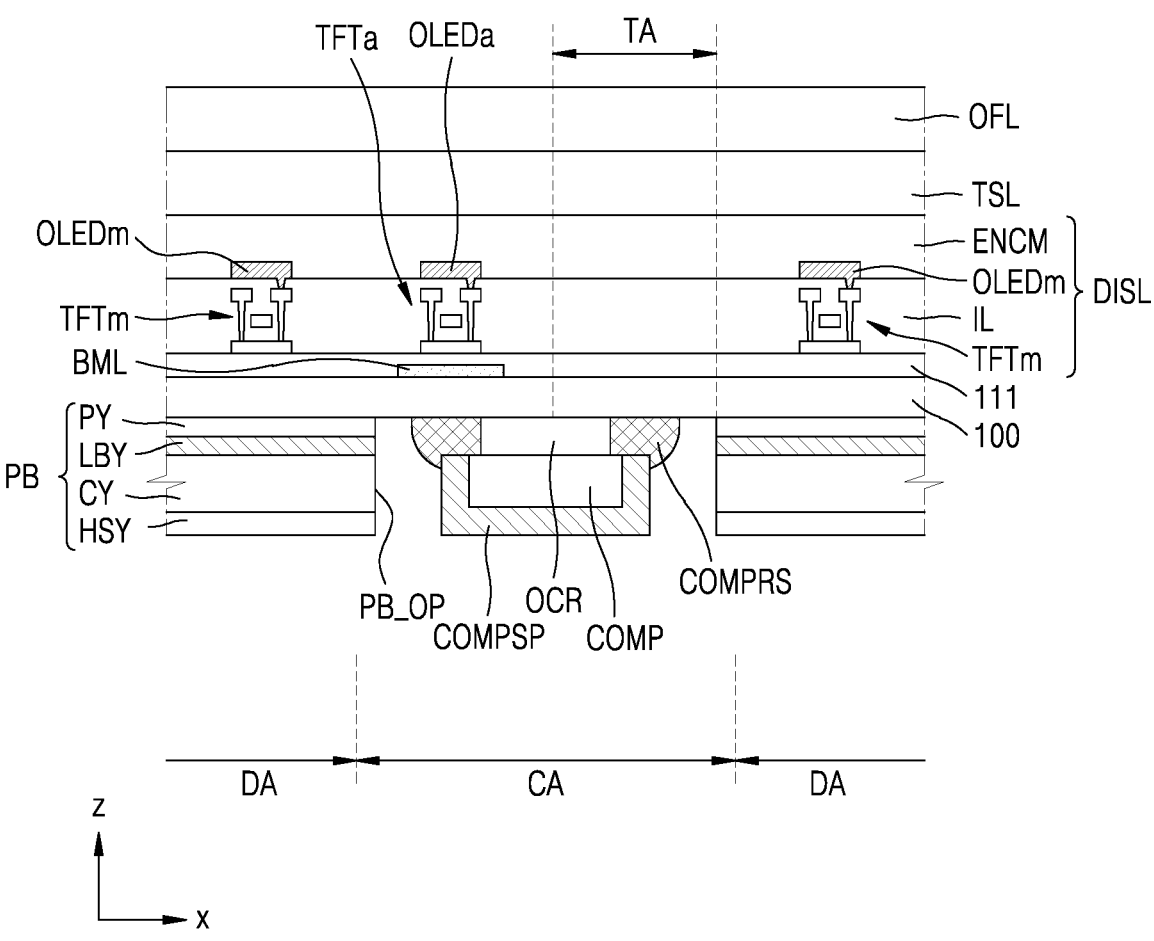

According to some example embodiments, the component COMP may be attached on the bottom of the display panel 10. In addition, as shown in FIG. 2D, the panel protection member PB may include a protective layer PY, a light-blocking layer LBY, a cushion layer CY, and a heat dissipation layer HSY. The protective layer PY may be attached on the bottom surface of the substrate 100 to protect the substrate 100 from the outside. For example, the protective layer PY may absorb physical impact from the outside or block foreign substances or moisture, etc. penetrating into the display layer DISL. The protective layer PY may be coated or attached in a film form on the bottom surface of the substrate 100.

According to some example embodiments, the protective layer PY may include a material blocking ultraviolet rays (UV). For example, the protective layer PY may include a base resin, a UV absorber, and inorganic particles. The UV absorber and inorganic particles may be dispersed in the base resin. The base resin may include an acrylate-based resin and include, for example, urethane acrylate. However, the embodiments according to the present disclosure are not limited thereto and a base resin which is optically transparent and may disperse UV absorbers and inorganic particles may be used for the protective layer without limitation.

For example, the UV absorber may include at least one of a benzotriazol-based compound, a benzophenone-based compound, a salicylic acid-based compound, a salicylate-based compound, a cyanoacrylate-based compound, a cinnamate-based compound, an oxanilide-based compound, polystyrene-based compound, an azomethine-based compound, or a triazine-based compound.

The light-blocking layer LBY may be arranged on the bottom surface of the protective layer PY, and the cushion layer CY may be arranged on the bottom surface of the light-blocking layer LBY. The light-blocking layer LBY may include a double-sided adhesive arranged between the protective layer PY and the cushion layer CY. In addition, the light-blocking layer LBY may be provided as a black layer to absorb external light. As described above, the light-blocking layer LBY may include various materials which may absorb external light.

The cushion layer CY may be attached on the bottom surface of the light-blocking layer LBY to protect the display panel 10 from the outside. The cushion layer CY may include a material having elasticity and be provided as, for example, a sponge or rubber, etc.

The heat dissipation layer HSY may be arranged under the cushion layer CY. The heat dissipation layer HSY may include a first heat dissipation layer and a second heat dissipation layer, the first heat dissipation layer including graphite or carbon nanotube, etc., and the second heat dissipation layer blocking electromagnetic waves and including a metal thin film including copper, nickel, ferrite, silver having excellent conductivity.

The panel protection member PB may include an opening PB_OP corresponding to the component area CA, and the component COMP may be arranged inside the opening PB_OP.

The component COMP may be mounted in a package COMPSP, and the package COMPSP may be attached on the bottom surface of the substrate 100 by using an adhesive member COMPRS. The package COMPSP may include a control circuit electrically connected to the component COMP.

According to some example embodiments, an optically transparent resin OCR may fill between the component COMP and the bottom surface of the substrate 100. The optically transparent resin OCR may have an optical transparency to minimize a loss of light incident to the component COMP.

The adhesive member COMPRS may fix the package COMPSP to the bottom surface of the substrate 100. The adhesive member COMPRS may include a resin. That is, the resin is arranged to contact the package COMPSP and the bottom surface of the substrate 100 and then a hardening operation through an UV may be performed. The adhesive member COMPRS may include a light-absorbing material.

Alternatively, according to some example embodiments, the component COMP may be apart from the display panel 10 as shown in FIGS. 2A to 2C. In this case, the component COMP may be attached and fixed to a bottom cover, etc. of the display apparatus 1.

The component COMP may include an electronic element that uses light or sound. For example, the electronic element may include a sensor configured to measure a distance such as a proximity sensor, a sensor configured to recognize a portion (e.g. a fingerprint, an iris, and a face) of a user's body, a small lamp configured to output light, and an image sensor (e.g. a camera) configured to capture an image. The electronic element that uses light may use light in various wavelength bands such as visible light, infrared light, and ultraviolet light. An electronic element that uses sound may use sound in ultrasound or sound in other frequency bands.

According to some example embodiments, the component COMP may include sub-components such as a light emitter and a light receiver. The light emitter and the light receiver may be provided as one body, or a pair of light emitter and light receiver that have physically separated structures may constitute one component COMP.

Figure 3:
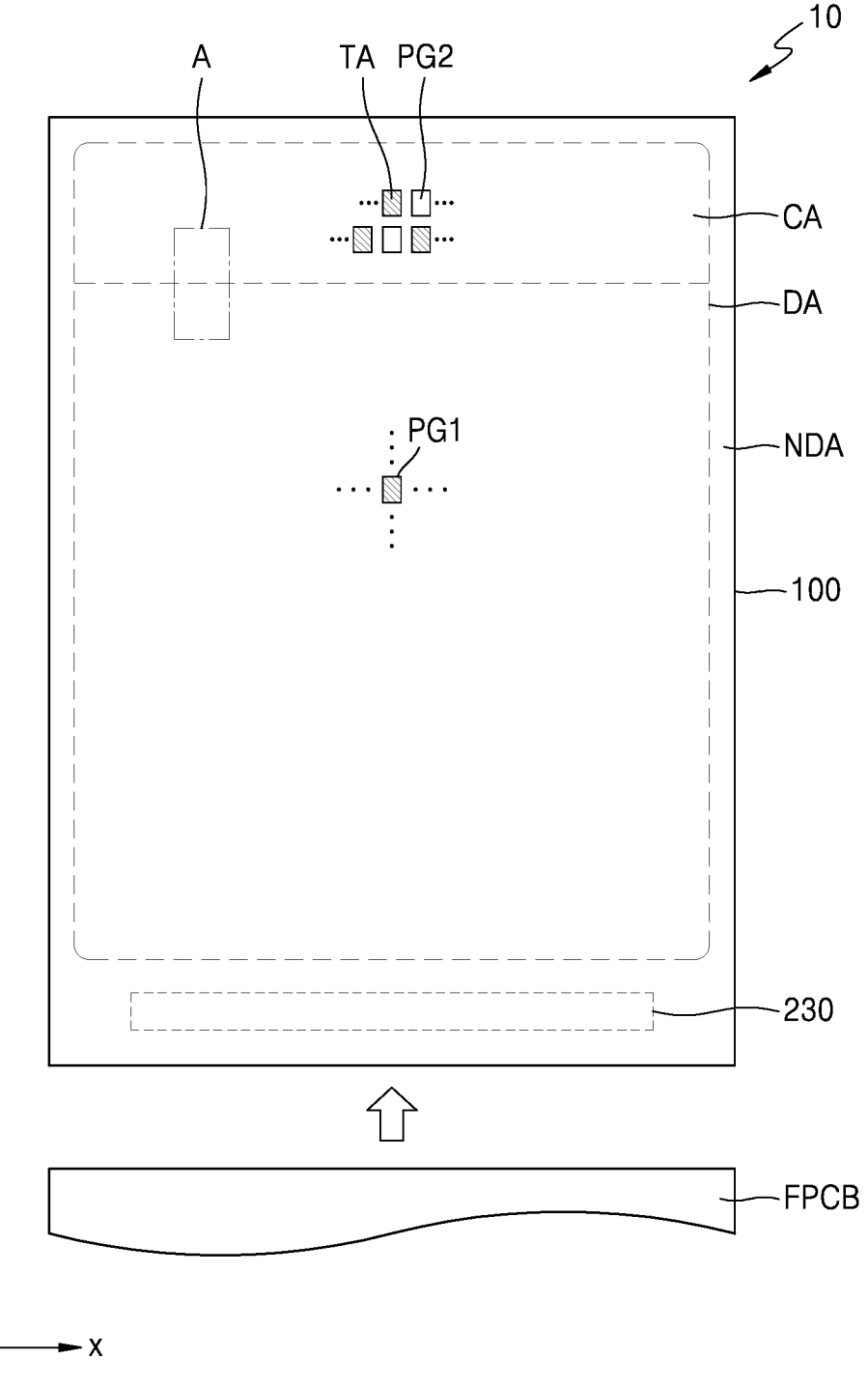
FIG. 3 is a plan view of a display panel according to some example embodiments.

FIG. 3 is a plan view of the display panel 10 according to some example embodiments.

The display panel 10 may include pixel groups arranged over the substrate 100. The substrate 100 may include the display area DA, the component area CA, and the non-display area NDA. For example, the display panel 10 may include the first pixel group PG1 and the second pixel group PG2, the first pixel group PG1 being arranged on the display area DA, and the second pixel group PG2 being arranged on the component area CA.

According to some example embodiments, the area of the display area DA may be different from the area of the component area CA. For example, the area of the display area DA may be greater than the area of the component area CA.

First pixel groups PG1 may be arranged two-dimensionally on the display area DA. Second pixel groups PG2 may be arranged two-dimensionally on the component area CA. In addition, the transmission portion TA may be arranged on the component area CA.

The non-display area NDA may entirely surround the display area DA. A scan driver, a data driver, etc. may be arranged in the non-display area NDA. A pad portion 230 may be arranged in the non-display area NDA. The pad portion 230 may neighbor one edge of the substrate 100. The pad portion 230 may be exposed by not being covered by an insulating layer and be electrically connected to a flexible printed circuit board FPCB. The flexible printed circuit board FPCB may electrically connect a controller to the pad portion 230 and supply a signal or power transferred from the controller. According to some example embodiments, a data driver may be arranged on the flexible printed circuit board FPCB. To transfer a signal or voltage from the flexible printed circuit board FPCB to the first pixel group PG1 and the second pixel group PG2, the pad portion 230 may be connected to a plurality of wirings.

A main sub-pixel of the first pixel group PG1 and an auxiliary sub-pixel of the second pixel group PG2 may each emit light having a preset color from an organic light-emitting diode. Each organic light-emitting diode may emit, for example, red, green, or blue light. Each organic light-emitting diode may be connected to a pixel circuit including a thin film transistor and a storage capacitor.

Figure 4:
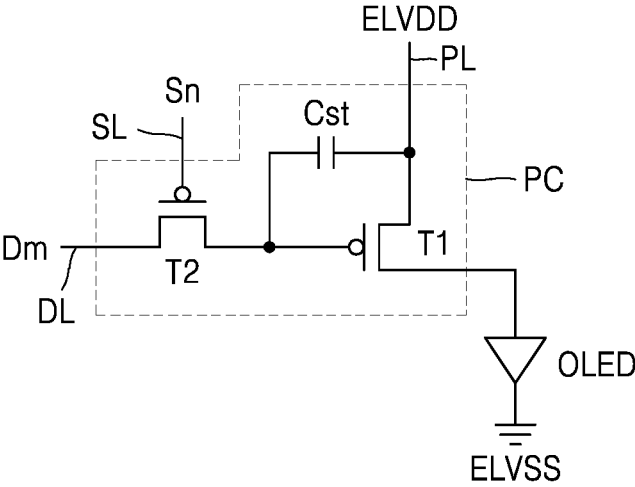
FIG. 4 is an equivalent circuit diagram of a pixel circuit connected to an organic light-emitting diode of a display apparatus according to some example embodiments.

FIG. 4 is an equivalent circuit diagram of a pixel circuit PC connected to an organic light-emitting diode OLED of the display apparatus 1 according to some example embodiments.

Referring to FIG. 4, the organic light-emitting diode OLED may be electrically connected to the pixel circuit PC. The pixel circuit PC may include a driving thin film transistor T1, a switching thin film transistor T2, and a storage capacitor Cst.

The switching thin film transistor T2 may be connected to a scan line SL and a data line DL and may transfer a data voltage or a data signal Dm to the driving thin film transistor T1 based on a switching voltage or a switching signal Sn input from the scan line SL, the data voltage or the data signal Dm being input from the data line DL. The storage capacitor Cst is connected to the switching thin film transistor T2 and a driving voltage line PL and stores a voltage corresponding to a difference between a voltage transferred from the switching thin film transistor T2 and a first power voltage ELVDD supplied to the driving voltage line PL.

The driving thin film transistor T1 is connected to the driving voltage line PL and the storage capacitor Cst and may control a driving current flowing through the organic light-emitting diode OLED from the driving voltage line PL in response to the voltage stored in the storage capacitor Cst. The organic light-emitting diode OLED may emit light having a certain brightness according to the driving current. An opposite electrode (e.g. a cathode) of the organic light-emitting diode OLED may receive a second power voltage ELVSS.

Though it is shown in FIG. 4 that the pixel circuit PC includes two thin film transistors and one storage capacitor, the number of thin film transistors and the number of storage capacitors may be variously modified depending on the design of the pixel circuit PC. For example, the pixel circuit PC may include three, four, five, or more thin film transistors.

Figure 5:
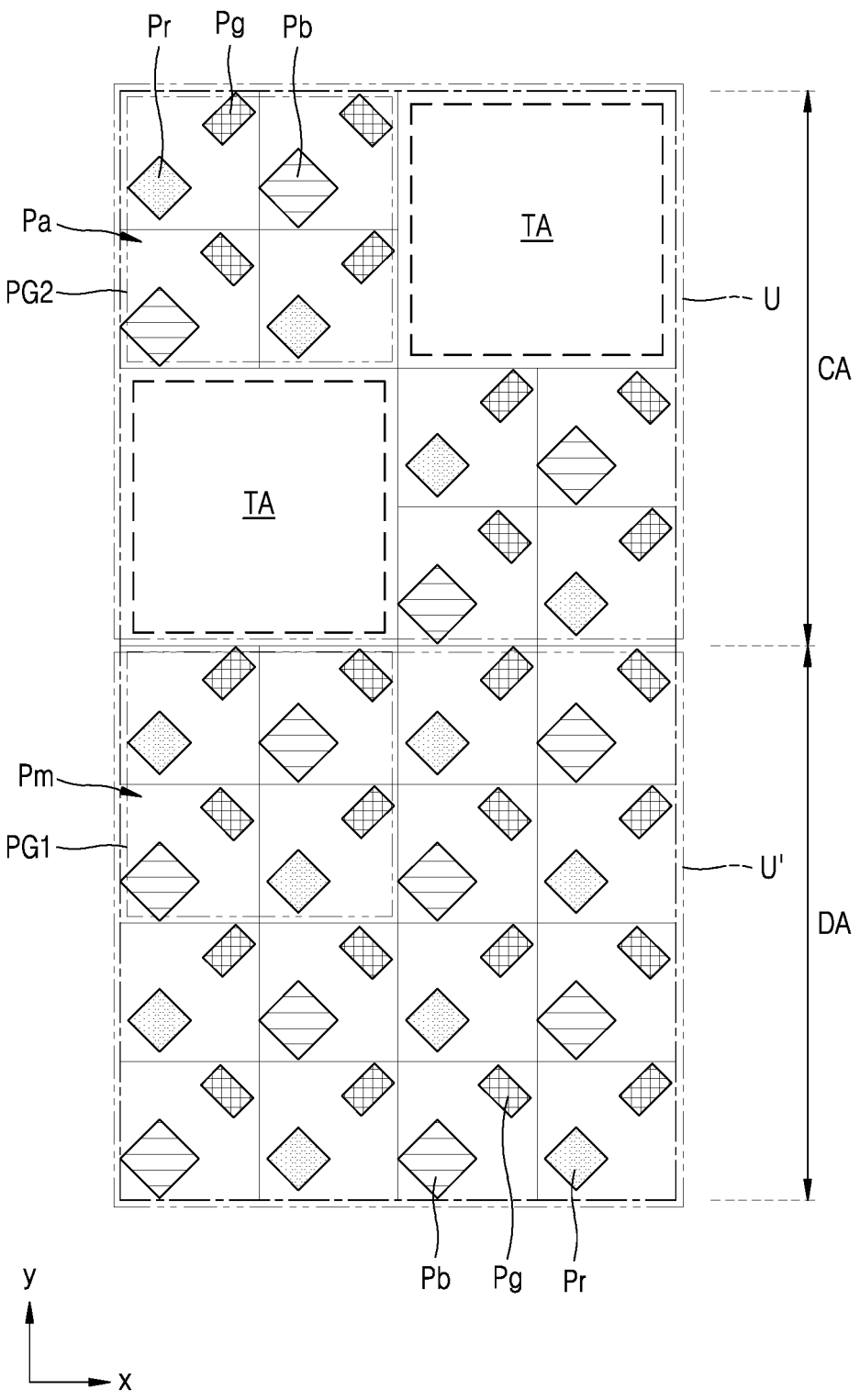
FIG. 5 is an enlarged view of the region A of FIG. 3.
Figure 6:
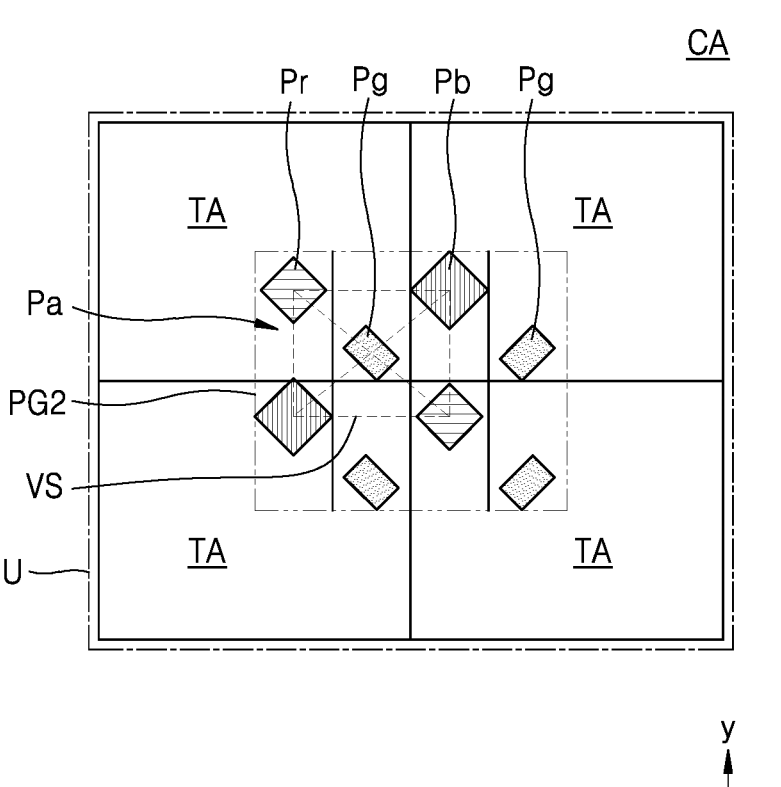
FIG. 6 is a plan view of a basic unit according to some example embodiments.

FIG. 5 is an enlarged view of a region A of FIG. 3. FIG. 6 is a plan view of a basic unit U according to some example embodiments.

Referring to FIG. 5, the substrate may include the display area DA and the component area CA. The first pixel group PG1 may be arranged on the display area DA, and the second pixel group PG2 and the transmission portion TA may be arranged on the component area CA.

The first pixel group PG1 may be defined as a sub-pixel aggregation in which a plurality of main sub-pixels Pm are bound on a preset basis. In the present specification, a sub-pixel denotes an emission area as a minimum unit configured to display an image. In the case where an organic light-emitting diode is employed as a display element, the emission area may be defined by an opening of a pixel-defining layer. This is described below.

One first pixel group PG1 may include 32 main sub-pixels Pm arranged in a pentile structure. For example, one first pixel group PG1 may include 8 red sub-pixels Pr, 16 green sub-pixels Pg, and 8 blue sub-pixels Pb. According to some example embodiments, the red sub-pixel Pr, the green sub-pixel Pg, and the blue sub-pixel Pb may be arranged in a stripe type in the first pixel group PG1. Various arrangement may be made. According to some example embodiments, the blue sub-pixel Pb and the red sub-pixel Pr may be greater than the green sub-pixel Pg. According to some example embodiments, the first group PG1 may further include a white sub-pixel.

The second pixel group PG2 may be defined as a sub-pixel aggregation in which a plurality of auxiliary sub-pixels Pa are bound on a preset basis. For example, one second pixel group PG2 may include 8 auxiliary sub-pixels Pa arranged in a pentile structure. That is, one second pixel group PG2 may include 2 red sub-pixels Pr, 4 green sub-pixels Pg, and 2 blue sub-pixels Pb. According to some example embodiments, the red sub-pixel Pr, the green sub-pixel Pg, and the blue sub-pixel Pb may be arranged in a stripe type in the second pixel group PG2. Various arrangement may be made. According to some example embodiments, the second group PG2 may further include a white sub-pixel.

The transmission portion TA may be arranged in plural on the component area CA. The second pixel group PG2 and the transmission portion TA are alternately arranged in an x-direction and a y-direction, for example, arranged in a lattice configuration. In this case, a plurality of second pixel groups PG2 and a plurality of transmission portions TA may be arranged on the component area CA.

A basic unit U may be repeatedly arranged in the x-direction and/or the y-direction on the component area CA, a preset number of second pixel groups PG2 and a present number of transmission portions TA being bound in the basic unit U. The basic unit U may have a shape in which two second pixel groups PG2 and two transmission portions TA arranged therearound are bound in a quadrangle. The basic unit U includes repeated shapes that are divided and does not mean disconnection of configuration.

A corresponding unit U' may be set on the display area DA, the corresponding unit U' having the same area as the area of the basic unit U. In this case, the number of main sub-pixels Pm included in the corresponding unit U' may be greater than the number of auxiliary sub-pixels Pa included in the basic unit U. That is, the number of auxiliary sub-pixels Pa included in the basic unit U is 16 and the number of main sub-pixels Pm included in the corresponding unit U' is 32. The number of auxiliary sub-pixels Pa and the number of main sub-pixels Pm per same area may be provided at a ratio of 1:2. According to some example embodiments, the number of auxiliary sub-pixels Pa and the number of main sub-pixels Pm per same area may be provided at a ratio of 1:4 or 1:16. However, the embodiments according to the present disclosure are not limited thereto.

The arrangement structure of the auxiliary sub-pixels Pa shown in FIG. 5 is a pentile structure, and a pixel arrangement structure of the component area CA in which a resolution is ½ of the resolution of the display area DA is called a ½ pentile structure. The number of auxiliary sub-pixels Pa or the arrangement of the auxiliary sub-pixels Pa included in the second pixel group PG2 may be modified depending on the resolution of the component area CA.

Referring to FIG. 6, a pixel arrangement structure of the component area CA may include a ¼ pentile structure. According to some example embodiments, though 8 auxiliary sub-pixels Pa are arranged in a pentile structure in the second pixel group PG2, the basic unit U may include only one second pixel group PG2. The rest of the regions of the basic unit U may be provided as the transmission portions TA. Therefore, the number of auxiliary sub-pixels Pa and the number of main sub-pixels Pm per same area may be provided at a ratio of 1:4. In this case, one second pixel group PG2 may be surrounded by the transmission portion TA.

A pentile structure may be expressed, in which: red sub-pixels Pr are respectively arranged on first and third vertexes among the vertexes of a virtual quadrangle VS with a green sub-pixel Pg centered at the center of the quadrangle, and blue sub-pixels Pb are respectively arranged on second and fourth vertexes, which are the rest of the vertexes. In this case, the virtual quadrangle VS may be variously modified to a rectangle, a rhombus, a square, etc. The pentile structure may implement high resolution with a small number of pixels by applying rendering that expresses colors by sharing neighboring pixels.

Figure 7A:
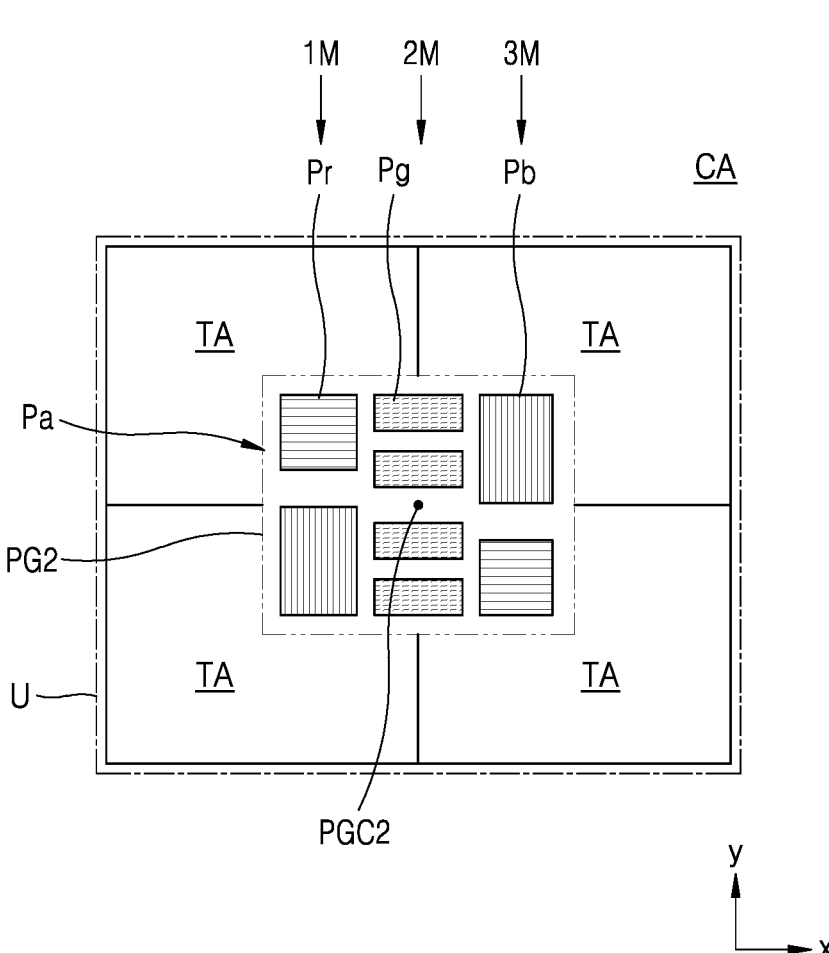
FIGS. 7A and 7B are plan views of a basic unit according to some example embodiments.
Figure 7B:
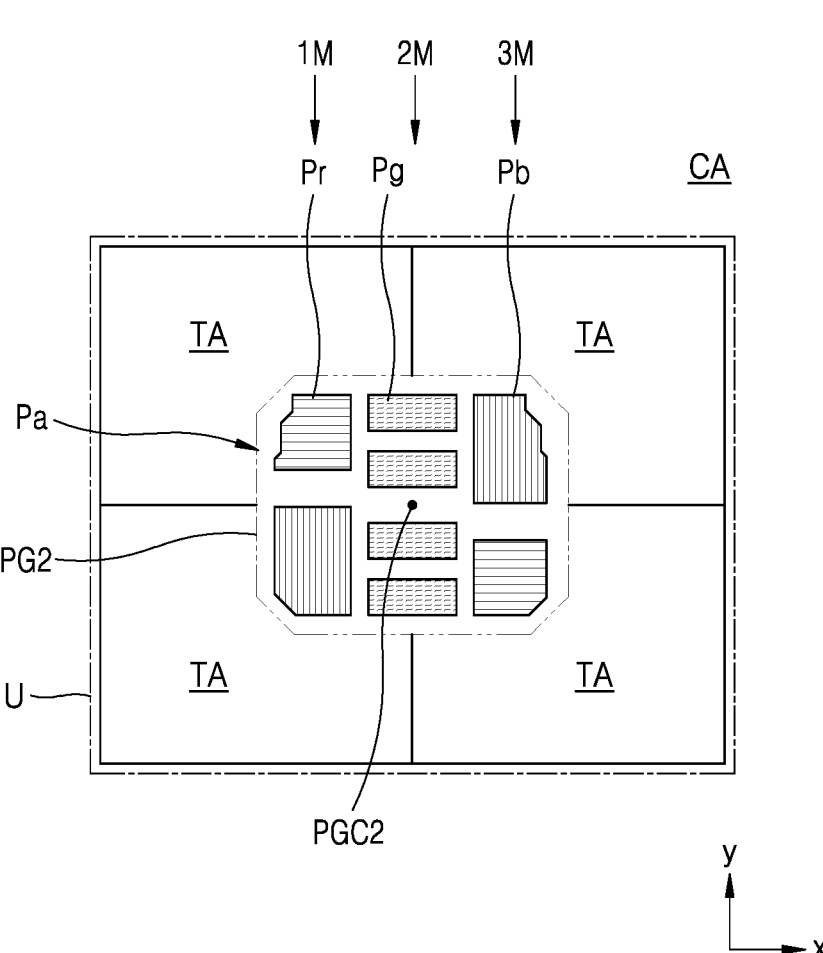

FIGS. 7A and 7B are plan views of a basic unit U according to some example embodiments. In FIGS. 7A and 7B, because the same reference numerals as those of FIG. 6 denote the same elements, some repeated descriptions thereof may be omitted.

Referring to FIGS. 7A and 7B, the transmission portions TA may surround the second pixel groups PG2. In addition, 8 auxiliary sub-pixels Pa may be arranged in the second pixel group PG2. For example, the second pixel group PG2 may include two red sub-pixels Pr, four green sub-pixels Pg, and two blue sub-pixels Pb.

According to some example embodiments, eight auxiliary sub-pixels Pa may be symmetrically arranged with respect to a center PGC2 of the second pixel group PG2. For example, a red sub-pixel Pr and a blue sub-pixel Pb may be arranged on a first column 1M, and four green sub-pixels Pg may be apart from each other on a second column 2M. In addition, a blue sub-pixel Pb and a red sub-pixel Pr may be arranged on a third column 3M. In this case, the red sub-pixel Pr on the first column 1M and the red sub-pixel Pr on the third column 3M may be symmetric with respect to the center PGC2 of the second pixel group PG2. The blue sub-pixel Pb on the first column 1M and the blue sub-pixel Pb on the third column 3M may be symmetric with respect to the center PGC2 of the second pixel group PG2. The green sub-pixels Pg on the second column 2M may be symmetric with respect to the center PGC2 of the second pixel group PG2.

According to some example embodiments, the length of the blue sub-pixel Pb in the y-direction may be greater than the length of the red sub-pixel Pr in the y-direction. The length of the blue sub-pixel Pb in the y-direction may be equal to or greater than a sum of the lengths of the two green sub-pixels Pg in the y-direction.

Referring to FIG. 7A, an auxiliary sub-pixel Pa may have a quadrangular shape having long sides and short sides. For example, a blue sub-pixel Pb and a red sub-pixel Pr may have a quadrangular shape having short sides in the x-direction and long sides in the y-direction. A green sub-pixel Pg may have a quadrangular shape having long sides in the x-direction and short sides in the y-direction.

Referring to FIG. 7B, one of a plurality of auxiliary sub-pixels Pa may have a quadrangular shape in plan view, and another may have a pentagonal shape in plan view. For example, a green sub-pixel Pg may have a quadrangular shape having long sides and short sides, and a red sub-pixel Pr and/or a blue sub-pixel Pb may have a pentagonal shape in plan view. In this case, the red sub-pixel Pr and/or the blue sub-pixel Pb may have sides in a direction intersecting the x-direction or the y-direction. Such sides may face the transmission portions TA. In another example, some of a plurality of auxiliary sub-pixels Pa may be n-gonal (n is an integer of 6 or more) in plan view. In this case, because an area of the basic unit U occupied by the second pixel group PG2 may be reduced and the area of the transmission portion TA may be increased, a light transmittance may be improved.

Figure 8:
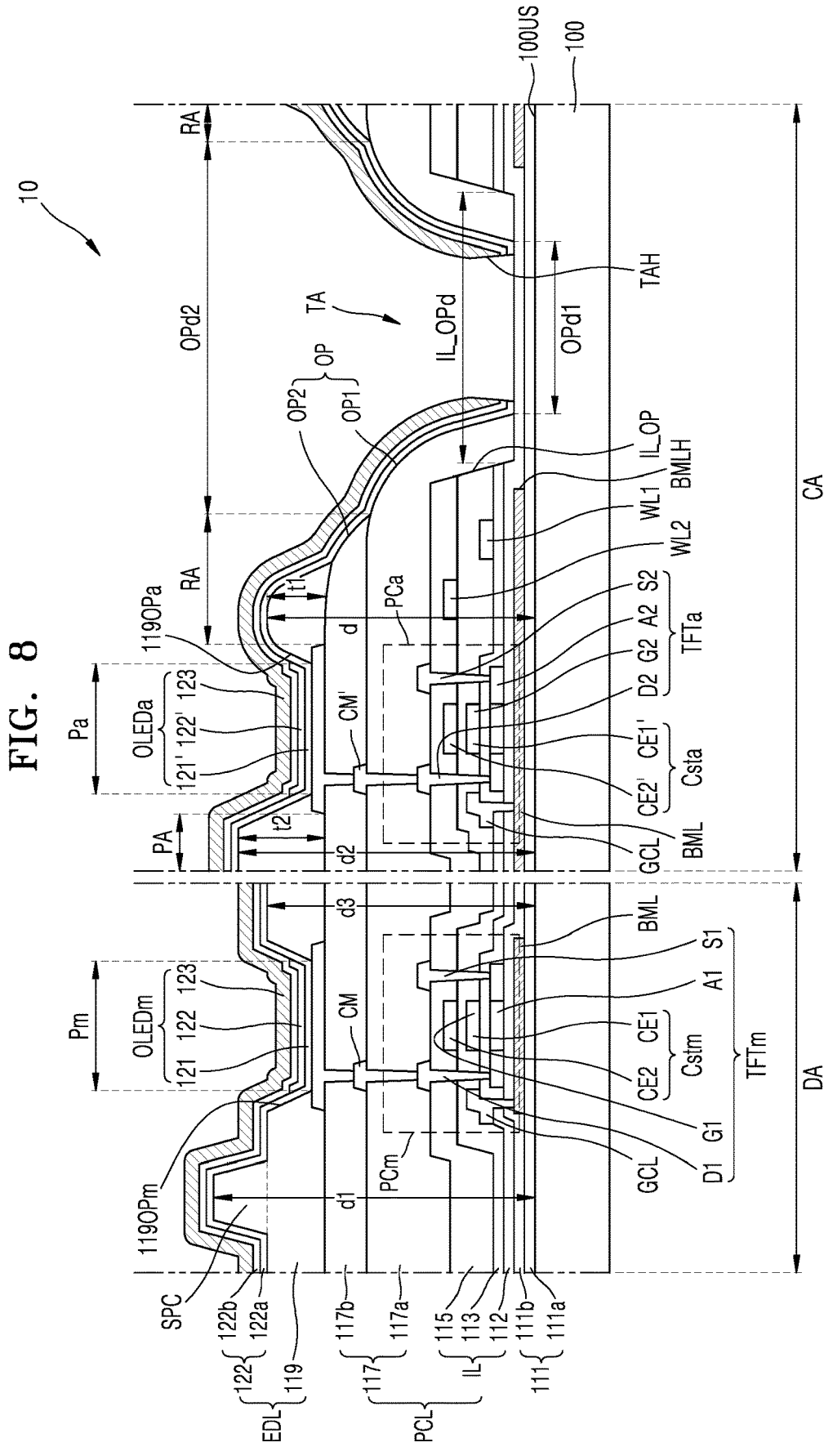
FIG. 8 is a cross-sectional view of a portion of a display panel according to some example embodiments.

FIG. 8 is a cross-sectional view of a portion of the display panel 10 according to some example embodiments.

Referring to FIG. 8, the display panel 10 may include the display area DA and the component area CA. Main sub-pixels Pm may be arranged on the display area DA, and auxiliary sub-pixels Pa and transmission portions TA may be arranged on the component area CA. A main organic light-emitting diode OLEDm as a display element and a main pixel circuit PCm including a main thin film transistor TFTm and a main storage capacitor Cstm may be arranged on the display area DA, the display element being connected to the main pixel circuit PCm. An auxiliary organic light-emitting diode OLEDa as a display element an auxiliary pixel circuit PCa including an auxiliary thin film transistor TFTa and an auxiliary storage capacitor Csta may be arranged on the component area CA, and the display element being connected to the auxiliary pixel circuit PCa.

Hereinafter, a structure in which elements included in the display panel 10 are stacked is described. In the display panel 10, the substrate 100, the buffer layer 111, the pixel circuit layer PCL, and the display element layer EDL may be stacked. In this case, the display area DA and the component area CA may be defined in each of the substrate 100, the buffer layer 111, the pixel circuit layer PCL, and the display element layer EDL.

As described above, the substrate 100 may include an insulating material such as glass, quartz, and a polymer resin. The substrate 100 may include a rigid substrate or a flexible substrate that is bendable, foldable, and rollable.

The buffer layer 111 may be arranged on the substrate 100 to reduce or block the penetration of foreign substances or external air from below the substrate 100 and may provide a flat surface on the substrate 100. The buffer layer 111 may include an inorganic material such as oxide or nitride, an organic material, or an organic/inorganic composite material and include a single layer or a multi-layer including an inorganic material and an organic material. A barrier layer may be further arranged between the substrate 100 and the buffer layer 111, the barrier layer blocking the penetration of external air. According to some example embodiments, the buffer layer 111 may include silicon oxide ($SiO_x$) or silicon nitride ($SiN_x$). According to some example embodiments, the buffer layer 111 may include a first buffer layer 111$a$ and a second buffer layer 111$b$ that are stacked.

A bottom metal layer BML may be arranged between the first buffer layer 111$a$ and the second buffer layer 111$b$ on the component area CA. According to some example embodiments, the bottom metal layer BML may be arranged between the substrate 100 and the first buffer layer 111$a$. According to some example embodiments, the bottom metal layer BML may be inserted into the substrate 100.

According to some example embodiments, the bottom metal layer BML may be arranged also on the display area DA. In this case, the bottom metal layer BML may be arranged below the main thin film transistor TFTm. According to some example embodiments, the bottom metal layer BML may not be arranged below a first semiconductor layer A1. Hereinafter, for convenience of description, the case where the bottom metal layer BML is arranged below the main thin film transistor TFTm is mainly described in detail.

The bottom metal layer BML may be arranged below the auxiliary pixel circuit PCa to prevent or reduce the characteristic of the auxiliary thin film transistor TFTa being deteriorated by light emitted from the component, etc. In addition, the bottom metal layer BML may prevent or reduce light being diffracted through a narrow gap between wirings connected to the auxiliary pixel circuit PCa, the light being emitted from the component or progressing toward the component. There is no bottom metal layer BML in the transmission portion TA. That is, the bottom metal layer BML may include a bottom hole BMLH corresponding to the transmission portion TA.

The bottom metal layer BML may be connected to a wiring GCL arranged on a different layer through a contact hole. The bottom metal layer BML may receive a constant voltage or signal from the wiring GCL. For example, the bottom metal layer BML may receive a first power voltage or a scan signal. Because the bottom metal layer BML receives a constant voltage or signal, a probability that electrostatic discharge occurs may be remarkably reduced. The bottom metal layer BML may include aluminum (Al), platinum (Pt), palladium (Pd), silver (Ag), magnesium (Mg), gold (Au), nickel (Ni), neodymium (Nd), iridium (Ir), chrome (Cr), calcium (Ca), molybdenum (Mo), titanium (Ti), tungsten (W), and/or copper (Cu). The bottom metal layer BML may include a single layer or a multi-layer including the above materials.

The pixel circuit layer PCL may be arranged on the buffer layer 111 and may include the pixel circuits PCm and PCa, an insulating layer IL, and an organic insulating layer 117. According to some example embodiments, the inorganic insulating layer IL may include a first gate insulating layer 112, a second gate insulating layer 113, and an interlayer insulating layer 115. According to some example embodiments, the organic insulating layer 117 may include a first organic insulating layer 117$a$ and a second organic insulating layer 117$b$. The main pixel circuit PCm may include the main thin film transistor TFTm and the main storage capacitor Cstm. The auxiliary pixel circuit PCa may include the auxiliary thin film transistor TFTa and the auxiliary storage capacitor Csta.

The main thin film transistor TFTm and the auxiliary thin film transistor TFTa may be arranged on the buffer layer 111. The main thin film transistor TFTm includes a first semiconductor layer A1, a first gate electrode G1, a first source electrode S1, and a first drain electrode D1. The auxiliary thin film transistor TFTa may include a second semiconductor layer A2, a second gate electrode G2, a second source electrode S2, and a second drain electrode D2. The main thin film transistor TFTm may be connected to the main organic light-emitting diode OLEDm to drive the main organic light-emitting diode OLEDm. The auxiliary thin film transistor TFTa may be connected to the auxiliary organic light-emitting diode OLEDa to drive the auxiliary organic light-emitting diode OLEDa.

The first semiconductor layer A1 and the second semiconductor layer A2 may be arranged on the buffer layer 111 and may include polycrystalline silicon. According to some example embodiments, the first semiconductor layer A1 and the second semiconductor layer A2 may include amorphous silicon. According to some example embodiments, the first semiconductor layer A1 and the second semiconductor layer A2 may include an oxide of at least one of indium (In), gallium (Ga), stannum (Sn), zirconium (Zr), vanadium (V), hafnium (Hf), cadmium (Cd), germanium (Ge), chromium (Cr), titanium (Ti), or zinc (Zn). Each of the first semiconductor layer A1 and the second semiconductor layer A2 may include a channel region, a source region, and a drain region, the source region and the drain region being doped with impurities.

The first semiconductor layer A1 may overlap the bottom metal layer BML with the second buffer layer 111$b$ therebetween. According to some example embodiments, the width of the first semiconductor layer A1 may be less than the width of the bottom metal layer BML and accordingly, when projected in a direction perpendicular to the substrate 100, the first semiconductor layer A1 may entirely overlap the bottom metal layer BML. According to some example embodiments, the bottom metal layer BML may be arranged to correspond to a portion of the display area DA. Alternatively, the bottom metal layer BML may be arranged to correspond to the entire display area DA. Alternatively, the bottom metal layer BML may be formed as one body in cooperation with the bottom metal layer BML of the component area CA. A constant voltage or signal may be applied to the bottom metal layer BML and accordingly, the damage to the main pixel circuit PCm due to electrostatic discharge may be prevented or reduced.

The second semiconductor layer A2 may overlap the bottom metal layer BML with the second buffer layer 111$b$ therebetween. According to some example embodiments, the width of the second semiconductor layer A2 may be less than the width of the bottom metal layer BML and accordingly, when projected in a direction perpendicular to the substrate 100, the second semiconductor layer A2 may entirely overlap the bottom metal layer BML.

The first gate insulating layer 112 may cover the first semiconductor layer A1 and the second semiconductor layer A2. The first gate insulating layer 112 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide (ZnO). The first gate insulating layer 112 may include a single layer or a multi-layer including the above inorganic insulating material.

The first gate electrode G1 and the second gate electrode G2 are arranged on the first gate insulating layer 112 to respectively overlap the first semiconductor layer A1 and the second semiconductor layer A2. The first gate electrode G1 and the second gate electrode G2 may include at least one of molybdenum (Mo), aluminum (Al), copper (Cu), or titanium (Ti) and may include a single layer or a multi-layer structure. For example, the first gate electrode G1 and the second gate electrode G2 may include a single Mo layer.

The second gate insulating layer 113 may cover the first gate electrode G1 and the second gate electrode G2. The second gate insulating layer 113 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide (ZnO). The second gate insulating layer 113 may include a single layer or a multi-layer including the above inorganic insulating material.

A first top electrode CE2 of the main storage capacitor Cstm and a second top electrode CE2' of the auxiliary storage capacitor Csta may be arranged on the second gate insulating layer 113.

On the display area DA, the first top electrode CE2 may overlap the first gate electrode G1 therebelow. The first gate electrode G1 and the first top electrode CE2 overlapping each other with the second gate insulating layer 113 therebetween may constitute the main storage capacitor Cstm. The first gate electrode G1 may serve as a first bottom electrode CE1 of the main storage capacitor Cstm.

On the component area CA, the second top electrode CE2' may overlap the second gate electrode G2 therebelow. The second gate electrode G2 and the second top electrode CE2' overlapping each other with the second gate insulating layer 113 therebetween may constitute the auxiliary storage capacitor Csta. The second gate electrode G2 may serve as a second bottom electrode CE1' of the auxiliary storage capacitor Csta.

The first top electrode CE2 and the second top electrode CE2' may include aluminum (Al), platinum (Pt), palladium (Pd), silver (Ag), magnesium (Mg), gold (Au), nickel (Ni), neodymium (Nd), iridium (Ir), chrome (Cr), calcium (Ca), molybdenum (Mo), titanium (Ti), tungsten (W), and/or copper (Cu) and include a single layer or a multi-layer including the above materials.

The interlayer insulating layer 115 may cover the first top electrode CE2 and the second top electrode CE2'. The interlayer insulating layer 115 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide (ZnO). The interlayer insulating layer 115 may include a single layer or a multi-layer including the above inorganic insulating material.

The inorganic insulating layer IL may include an insulating layer opening IL_OP corresponding to the transmission portion TA. The insulating layer opening IL_OP may expose a portion of the buffer layer 111 or a top surface 100US of the substrate 100. The insulating layer opening IL_OP may include an opening of the first gate insulating layer 112, an opening of the second gate insulating layer 113, and an opening of the interlayer insulating layer 115 which overlap one another and correspond to the transmission portion TA. The openings may be individually formed through separate processes or simultaneously formed through the same process. In the case where the openings are formed through the separate processes, the inner surface of the insulating layer opening IL_OP may not be smooth and may have a stair-like step difference. Unlike this, according to some example embodiments, the inorganic insulating layer IL may include a groove, not the insulating layer opening IL_OP.

The source electrodes S1 and S2 and the drain electrodes D1 and D2 are arranged on the interlayer insulating layer 115. The source electrodes S1 and S2 and the drain electrodes D1 and D2 may include a conductive material including molybdenum (Mo), aluminum (Al), copper (Cu), and titanium (Ti) and include a single layer or a multi-layer including the above materials. For example, the source electrodes S1 and S2 and the drain electrodes D1 and D2 may have a multi-layered structure of Ti/Al/Ti.

A first organic insulating layer 117a may cover the source electrodes S1 and S2 and the drain electrodes D1 and D2. A portion of the first organic insulating layer 117a may have a flat top surface. In addition, the first organic insulating layer 117a may include a first opening OP1 corresponding to the transmission portion TA. The first opening OP1 may expose a portion of a top surface of the buffer layer 111 or the top surface 100US of the substrate 100. According to some example embodiments, a size OPd1 of the first opening OP1 may be less than a size IL_OPd of the insulating layer opening IL_OP. The size OPd1 of the first opening OP1 may be defined as a shortest distance between the surfaces of the first organic insulating layer 117a that face each other. The size IL_OPd of the insulating layer opening IL_OP may be defined as a shortest distance between surfaces of the inorganic insulating layer IL that face each other. Therefore, the first organic insulating layer 117a may cover an inner surface of the insulating layer opening IL_OP. According to some example embodiments, the first organic insulating layer 117a may be omitted.

The first organic insulating layer 117a may include a general-purpose polymer such as benzocyclobutene (BCB), polyimide, hexamethyldisiloxane (HMDSO), polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, or a vinyl alcohol-based polymer.

The second organic insulating layer 117b may be arranged on the first organic insulating layer 117a. The second organic insulating layer 117b may include a second opening OP2 corresponding to the transmission portion TA. The second opening OP2 may expose a portion of a top surface of the buffer layer 111 or the top surface 100US of the substrate 100. According to some example embodiments, a size OPd2 of the second opening OP2 may be greater than the size OPd1 of the first opening OP1. The size OPd2 of the second opening OP2 may be defined as a shortest distance between surfaces of the second opening OP2 that face each other. Therefore, the second opening OP2 may expose a portion of the substrate 100 and the inorganic insulating layer IL, a portion of the buffer layer 111, and a portion of the first organic insulating layer 117a.

According to some example embodiments, the second organic insulating layer 117b may have a flat top surface on the display area DA and include a planarization area PA on the component area CA. The planarization area PA includes a flat top surface of the second organic insulating layer 117b. In addition, on the component area CA, the second organic insulating layer 117b may include a reduction area RA having a reducing thickness in a direction from the planarization area PA to the second opening OP2. A top surface of the second organic insulating layer 117b may include a curvature portion in the reduction area RA. Alternatively, the top surface of the second organic insulating layer 117b in the reduction area RA may not be flat. According to some example embodiments, the reduction area RA may be arranged on a flat top surface of the first organic insulating layer 117a. Alternatively, the reduction area RA may be formed on the top surface of the first organic insulating layer 117a that is not flat.

The second organic insulating layer 117b may include a general-purpose polymer such as benzocyclobutene (BCB), polyimide, hexamethyldisiloxane (HMDSO), polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, or a vinyl alcohol-based polymer.

According to some example embodiments, the second organic insulating layer 117b includes the second opening OP2 corresponding to the transmission portion TA. Due to the viscosity of an organic material itself included in the second organic insulating layer 117b, the reduction area RA may be formed. Therefore, a portion of the second organic insulating layer 117b may not be flat.

Connection metals CM and CM' may be arranged between the first organic insulating layer 117a and the second organic insulating layer 117b. The connection metals CM and CM' may be respectively connected to the thin film transistors, that is, the main thin film transistor TFTm and the auxiliary thin film transistor TFTa through contact holes of the first organic insulating layer 117a. The connection metals CM and CM' may include a conductive material including molybdenum (Mo), aluminum (Al), copper (Cu), and titanium (Ti) and include a single layer or a multi-layer including the above materials. For example, the connection metals CM and CM' may have a multi-layered structure of Ti/Al/Ti.

The display element layer EDL may be arranged on the second organic insulating layer 117b. The display element layer EDL may include a pixel-defining layer 119 and the organic light-emitting diodes, that is, the main organic light-emitting diode OLEDm and the auxiliary organic light-emitting diode OLEDa. The organic light-emitting diodes, that is, the main organic light-emitting diode OLEDm and the auxiliary organic light-emitting diode OLEDa may include first and second pixel electrodes 121 and 121'. The first and second pixel electrodes 121 and 121' may be connected to the pixel circuits, that is, the main pixel circuit PCm and the auxiliary pixel circuit PCa through the connection metals CM and CM' arranged on the first organic insulating layer 117a.

The first and second pixel electrodes 121 and 121' may be arranged on the second organic insulating layer 117b. The first and second pixel electrodes 121 and 121' may include a conductive oxide such as indium tin oxide (ITO), indium zinc oxide (IZO), zinc oxide (ZnO), indium oxide (In$_2$O$_3$), indium gallium oxide (IGO), or aluminum zinc oxide (AZO). The first and second pixel electrodes 121 and 121' may include a reflective layer including silver (Ag), magnesium (Mg), aluminum (Al), platinum (Pt), palladium (Pd), gold (Au), nickel (Ni), neodymium (Nd), iridium (Ir), chrome (Cr), or a compound thereof. For example, the first and second pixel electrodes 121 and 121' may have a structure including layers including ITO, IZO, ZnO, or In$_2$O$_3$ on/under the reflective layer. In this case, the first and second pixel electrodes 121 and 121' may have a structure of ITO/Ag/ITO that are stacked.

The pixel-defining layer 119 may cover the edges of the first and second pixel electrodes 121 and 121' on the second organic insulating layer 117b and include openings 119OPm and 119OPa exposing the central portions of the first and second pixel electrodes 121 and 121'. Emission areas of the organic light-emitting diodes, that is, the main organic light-emitting diode OLEDm and the auxiliary organic light-emitting diode OLEDa may be defined by the openings 119OPm and 119OPa, the emission areas being the sizes and the shapes of the main sub-pixel Pm and the auxiliary sub-pixel Pa.

According to some example embodiments, on the component area CA, a portion of the pixel-defining layer 119 may be arranged on the reduction area RA, and a portion of the pixel-defining layer 119 may be arranged on the planarization area PA. In this case, a first thickness t1 of the pixel-defining layer 119 arranged on the reduction area RA may be less than a second thickness t2 of the pixel-defining layer 119 arranged on the planarization area PA. In this case, the first thickness t1 may be defined as a maximum value of a distance between a top surface of the reduction area RA and a top surface of the pixel-defining layer 119 on the reduction area RA. While the pixel-defining layer 119 is formed on the reduction area RA, the pixel-defining layer 119 may be hardened on the reduction area RA. In this case, while the pixel-defining layer 119 on the reduction RA is hardened, a reflow may occur in a direction to the second opening OP2 and accordingly, a thickness of the pixel-defining layer 119 may decrease. Therefore, the first thickness t1 may be less than the second thickness t2.

In addition, similar to the organic insulating layer 117, the pixel-defining layer 119 may include an opening corresponding to the transmission portion TA.

The pixel-defining layer 119 may include an organic insulating material such as polyimide, polyamide, an acrylic resin, benzocyclobutene, HMDSO, and a phenolic resin.

According to some example embodiments, a spacer SPC may be further arranged on the pixel-defining layer 119 on the display area DA. That is, the spacer SPC may overlap the display area DA. The spacer SPC may include the same material as the pixel-defining layer 119. That is, according to some example embodiments, the spacer SPC may be provided as one body with the pixel-defining layer 119. In the case where a top substrate is coupled and/or in the case where a process that uses a mask is performed, the spacer SPC may prevent or reduce instances of the organic light-emitting diodes, that is, the main organic light-emitting diode OLEDm and the auxiliary organic light-emitting diode OLEDa being damaged.

According to some example embodiments, a first distance d1 from the top surface 100US of the substrate 100 to a top surface of the spacer SPC may be greater than a second distance d2 from the top surface 100US of the substrate 100 to a top surface of the pixel-defining layer 119 arranged on the component area CA. In this case, the first distance d1 may be defined as a maximum vertical distance from the top surface 100US of the substrate 100 to the top surface of the spacer SPC, and the second distance d2 may be defined as a maximum vertical distance from the top surface 100US of the substrate 100 to the top surface of the pixel-defining layer 119 arranged on the planarization area PA. In addition, according to some example embodiments, the second distance d2 may be greater than a third distance d3 from the top surface 100US of the substrate 100 to the top surface of the pixel-defining layer 119 on the display area DA. Therefore, the pixel-defining layer 119 arranged on the planarization area PA may serve as the spacer SPC on the display area DA.

In addition, a distance d from the top surface 100US of the substrate 100 to the top surface of the pixel-defining layer 119 arranged on the reduction area RA may be less than a distance from the top surface 100US of the substrate 100 to the top surface of the pixel-defining layer 119 arranged on the planarization area PA. In this case, the distance d may be defined as a maximum vertical distance from the top surface 100US of the substrate 100 to the top surface of the pixel-defining layer 119 arranged on the reduction area RA. According to some example embodiments, the distance d from the top surface 100US of the substrate 100 to the top surface of the pixel-defining layer 119 arranged on the reduction area RA may be the same as the third distance d3 from the top surface 100US of the substrate 100 to the top surface of the pixel-defining layer 119 arranged on the display area DA.

The pixel-defining layer 119 may prevent or reduce instances of an arc, etc., occurring at the edges of the pixel electrodes, that is, the first and second pixel electrodes 121 and 121' by increasing a distance between the edges of the first and second pixel electrodes 121 and 121' and the opposite electrode 123 over the first and second pixel electrodes 121 and 121'. The pixel-defining layer 119 may include an organic insulating material such as polyimide, polyamide, an acrylic resin, benzocyclobutene, HMDSO, and a phenolic resin and be formed by using spin coating, etc.

According to some example embodiments, the spacer SPC may be simultaneously formed with the pixel-defining layer 119. For example, the spacer SPC and the pixel-defining layer 119 may be formed on the display area DA by using a half-tone mask, and the pixel-defining layer 119 may be formed on the component area CA by using a full-tone mask.

In the case where the spacer SPC and the pixel-defining layer 119 are formed by using a half-tone mask also on the component area CA, the pixel-defining layer 119 may be formed relatively thin on the component area CA and accordingly, may not clearly define the emission area of the auxiliary organic light-emitting diode OLEDa. That is, the transmission portion TA may be arranged on the component area CA, and the inorganic insulating layer IL, the first organic insulating layer 117a, the second organic insulating layer 117b, and the pixel-defining layer 119 may each include an opening. In this case, due to the reduction area RA of the second organic insulating layer 117b, the insulating layer opening IL_OP of the inorganic insulating layer IL, the first opening OP1, the second opening OP2, and the second organic insulating layer 117b, a thickness of the pixel-defining layer 119 on the component area CA may be less than a thickness of the pixel-defining layer 119 on the display area DA. In this case, when the pixel-defining layer 119 and the spacer SPC are formed on the component area CA, the emission area of the auxiliary organic light-emitting diode OLEDa is not defined and accordingly, blurring of light emitted from the auxiliary organic light-emitting diode OLEDa may occur. Therefore, the auxiliary organic light-emitting diode OLEDa may emit light in an undesired region.

According to some example embodiments, because the pixel-defining layer 119 is formed on the component area CA by using a full-tone mask, not a half-tone mask, the emission area of the auxiliary organic light-emitting diode OLEDa may be clearly defined. Therefore, blurring of light emitted from the auxiliary organic light-emitting diode OLEDa may be prevented or reduced.

In addition, because the pixel-defining layer 119 is formed on the component area CA by using a full-tone mask, the pixel-defining layer 119 on the planarization area PA may serve, as a whole, as the spacer SPC of the display area DA. Therefore, in the case of performing a process that uses a mask, the damage to the auxiliary organic light-emitting diode OLEDa may be prevented or reduced. That is, a defect of chopping of the auxiliary organic light-emitting diode OLEDa may be reduced.

A first emission layer 122b and a second emission layer 122b' are arranged inside the openings 119OPm and 119OPa of the pixel-defining layer 119, the first emission layer 122b and the second emission layer 122b' respectively corresponding to the first pixel electrode 121 and the second pixel electrode 121'. The first emission layer 122b and the second emission layer 122b' may include a polymer material or a low molecular weight material and emit red, green, blue, or white light.

An organic functional layer 122e may be arranged on and/or under the first emission layer 122b and the second emission layer 122b'. The organic functional layer 122e may include a first functional layer 122a and/or a second functional layer 122c. The first functional layer 122a or the second functional layer 122c may be omitted.

The first functional layer 122a may be arranged under the first emission layer 122b and the second emission layer 122b'. The first functional layer 122a may include a single layer or a multi-layer including an organic material. The first functional layer 122a may include a hole transport layer (HTL), which has a single-layered structure. Alternatively, the first functional layer 122a may include a hole injection layer (HIL) and an HTL. The first functional layer 122a may be formed as one body to correspond to the organic light-emitting diodes, that is, the main organic light-emitting diode OLEDm and the auxiliary organic light-emitting diode OLEDa arranged on the display area DA and the component area CA.

The second functional layer 122c may be arranged on the first emission layer 122b and the second emission layer 122b'. The second functional layer 122c may include a single layer or a multi-layer including an organic material. The second functional layer 122c may include an electron transport layer (ETL) and/or an electron injection layer (EIL). The second functional layer 122c may be formed as one body to correspond to the organic light-emitting diodes, that is, the main organic light-emitting diode OLEDm and the auxiliary organic light-emitting diode OLEDa arranged on the display area DA and the component area CA.

The opposite electrode 123 may be arranged on the second functional layer 122c. The opposite electrode 123 may include a conductive material having a small work function. For example, the opposite electrode 123 may include a (semi) transparent layer including silver (Ag), magnesium (Mg), aluminum (Al), platinum (Pt), palladium (Pd), gold (Au), nickel (Ni), neodymium (Nd), iridium (Ir), chrome (Cr), lithium (Li), calcium (Ca), or an alloy thereof. Alternatively, the opposite electrode 123 may include a layer including ITO, IZO, ZnO, or $In_2O_3$ on the (semi) transparent layer including the above material. The opposite electrode 123 may be formed as one body to correspond to the organic light-emitting diodes, that is, the main organic light-emitting diode OLEDm and the auxiliary organic light-emitting diode OLEDa included on the display area DA and the component area CA.

The layers from the first pixel electrode 121 to the opposite electrode 123 on the display area DA may constitute the main organic light-emitting diode OLEDm. The layers from the second pixel electrode 121' to the opposite electrode 123 on the component area CA may constitute the auxiliary organic light-emitting diode OLEDa.

According to some example embodiments, a top layer may be formed on the opposite electrode 123, the top layer including an organic material. The top layer may include a layer configured to protect the opposite electrode 123 and increase a light extraction efficiency. The top layer may include an organic material having a higher refractive index than the opposite electrode 123. Alternatively, the top layer may include layers having different refractive indexes that are stacked. For example, the top layer may include a high refractive index layer/a low refractive index layer/a high refractive index layer that are stacked. In this case, a refractive index of a high refractive index layer may be 1.7 or more, and a refractive index of a low refractive index layer may be 1.3 or less. The top layer may further include lithium fluoride (LiF). Alternatively, the top layer may further include an inorganic insulating material such as silicon nitride ($SiN_x$) and silicon oxide ($SiO_x$).

The first functional layer 122a, the second functional layer 122c, and the opposite electrode 123 may include a transmission hole TAH corresponding to the transmission portion TA. That is, each of the first functional layer 122a, the second functional layer 122c, and the opposite electrode 123 may include an opening corresponding to the transmission portion TA. Due to the transmission hole TAH, a portion of the opposite electrode 123 is removed from the transmission portion TA. Through this, a light transmittance of the transmission portion TA may be remarkably increased.

In addition, the display panel 10 may include a first wiring WL1 and a second wiring WL2 arranged on different layers. The first wiring WL1 may be arranged on the first gate insulating layer 112, which is the same layer as the first gate electrode G1 and the second gate electrode G2. The second wiring WL2 may be arranged on the second gate insulating layer 113, which is the same layer as the top electrodes, that is, the first top electrode CE2 and the second top electrode CE2' of the main and auxiliary storage capacitors Cstm and Csta. In addition, according to some example embodiments, wirings may be arranged also on the interlayer insulating layer 115. These wirings may serve as at least one of a scan line, a driving voltage line, or a data line. At least one of the first wiring WL1 or the second wiring WL2 may include a conductive material including molybdenum (Mo), aluminum (Al), copper (Cu), and titanium (Ti) and include a single layer or a multi-layer including the above materials. At least one of the first wiring WL1 or the second wiring WL2 may include a transparent conductive material.

Figure 9:
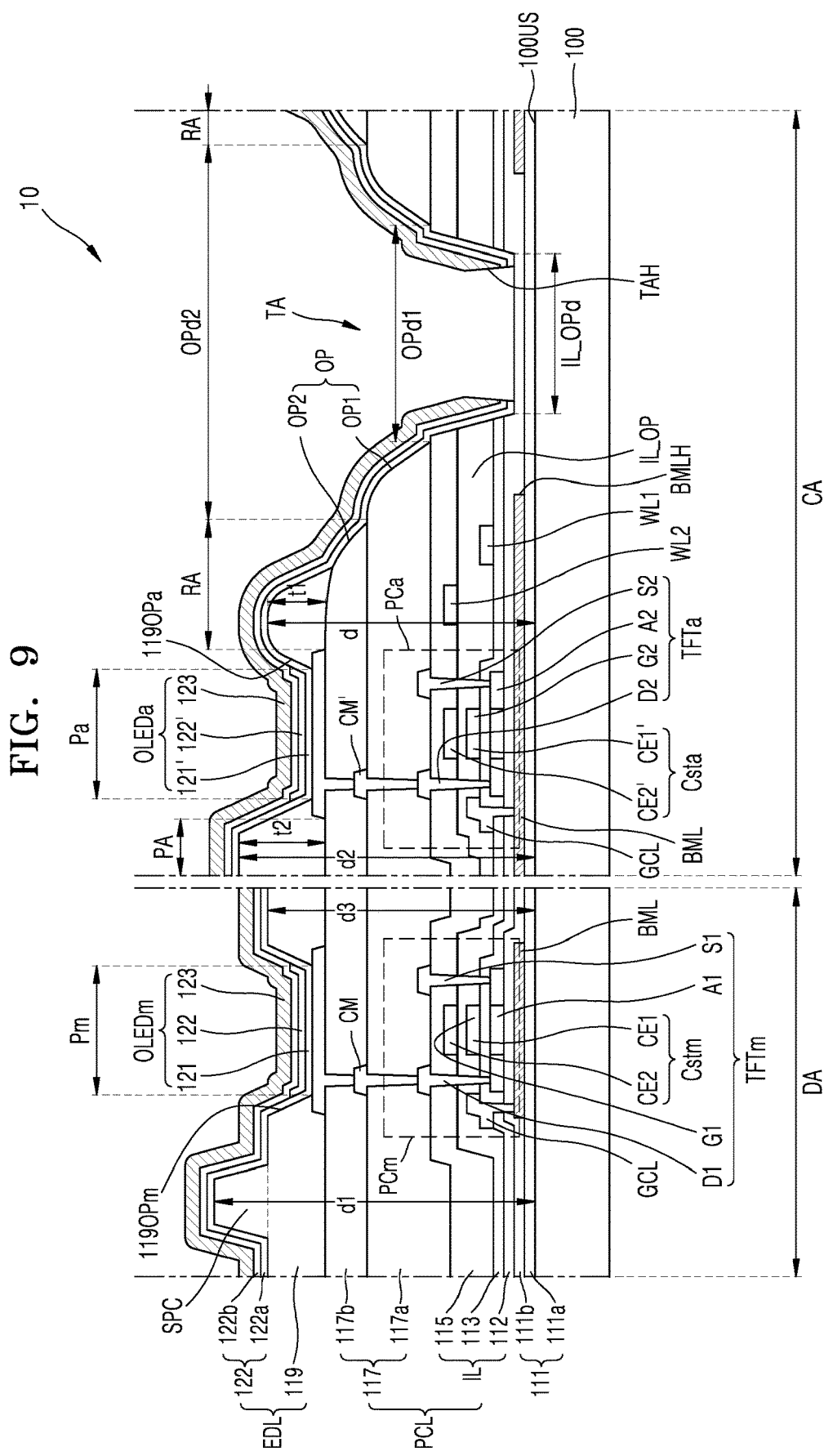
FIG. 9 is a cross-sectional view of a portion of a display panel according to some example embodiments.

FIG. 9 is a cross-sectional view of a portion of the display panel 10 according to some example embodiments. In FIG. 9, because the same reference numerals as those of FIG. 6 denote the same elements, some repeated descriptions thereof may be omitted.

In FIG. 9, the substrate 100 may include the display area DA and the component area CA in which the transmission portion TA is arranged. The inorganic insulating layer IL and the organic insulating layer 117 may be arranged on the substrate 100. The organic light-emitting diodes, that is, the main organic light-emitting diode OLEDm and the auxiliary organic light-emitting diode OLEDa, which are display elements, may be arranged on the organic insulating layer 117 and may include the pixel electrodes, that is, the first pixel electrode 121 and the second pixel electrode 121' and the opposite electrode 123. The pixel-defining layer 119 may cover the edges of the pixel electrodes, that is, the first pixel electrode 121 and the second pixel electrode 121', and define the emission areas of the organic light-emitting diodes, that is, the main organic light-emitting diode OLEDm and the auxiliary organic light-emitting diode OLEDa.

The inorganic insulating layer IL may include the insulating layer opening IL_OP corresponding to the transmission portion TA. The organic insulating layer 117 may include the first organic insulating layer 117a and the second organic insulating layer 117b. The first organic insulating layer 117a and the second organic insulating layer 117b may respectively include the first opening OP1 and the second opening OP2 corresponding to the transmission portion TA.

In this case, on the component area CA, the second organic insulating layer 117b may include the planarization area PA and the reduction area RA, the reduction area RA having a thickness that decreases in a direction from the planarization area PA to the second opening OP2. A portion of the pixel-defining layer 119 may be arranged on the reduction area RA.

According to some example embodiments, the size OPd1 of the first opening OP1 may be greater than the size IL_OPd of the insulating layer opening IL_OP. In this case, the first opening OP1 may expose a portion of the inorganic insulating layer IL. For example, the first opening OP1 may expose an inner surface of the insulating layer opening IL_OP. In addition, according to some example embodiments, the first opening OP1 may expose a portion of the top surface of the inorganic insulating layer IL.

Figure 10:
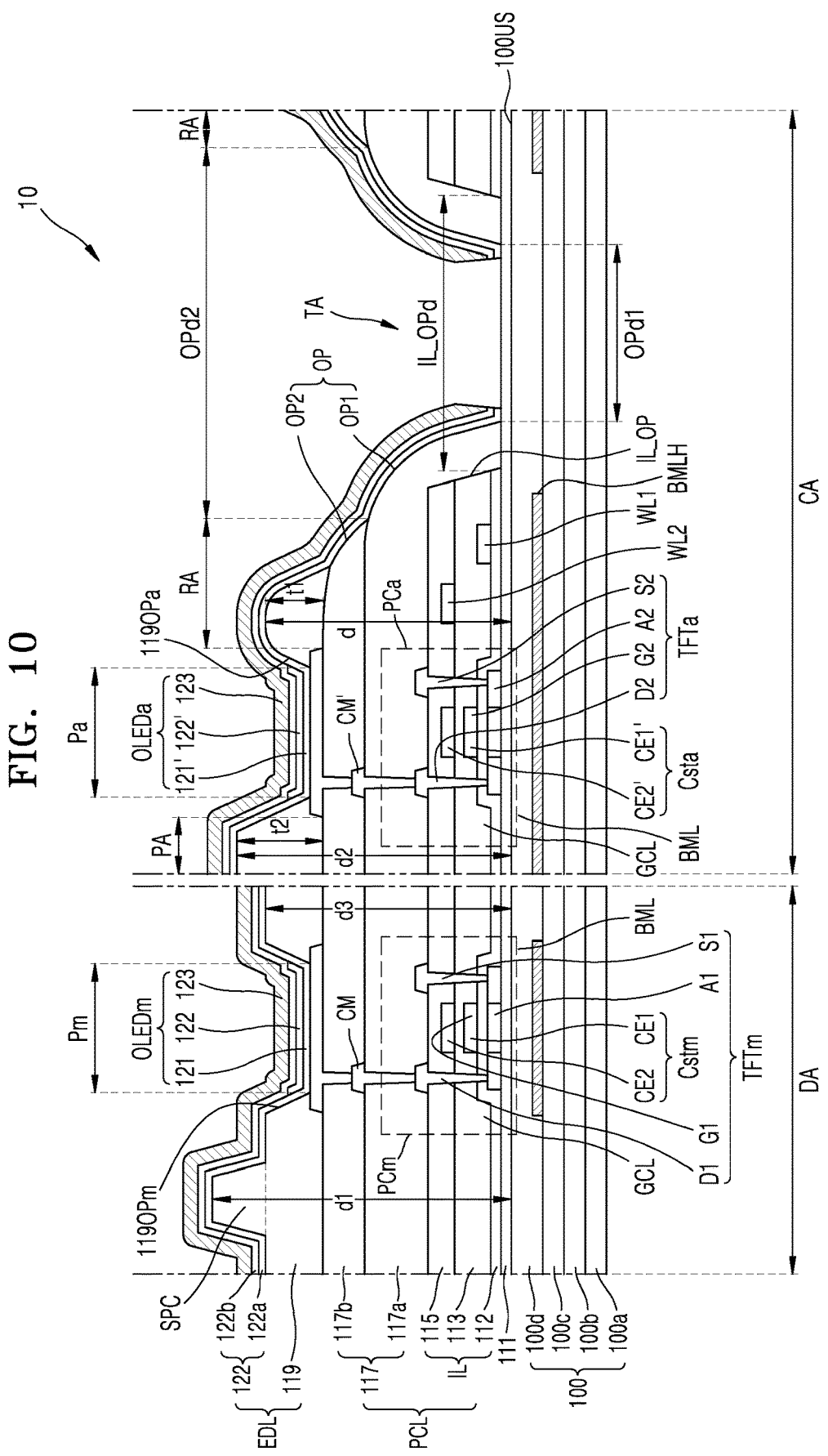
FIG. 10 is a cross-sectional view of a portion of a display panel according to some example embodiments.

FIG. 10 is a cross-sectional view of a portion of the display panel 10 according to some example embodiments. In FIG. 10, because the same reference numerals as those of FIG. 8 denote the same elements, some repeated descriptions thereof may be omitted.

Referring to FIG. 10, the substrate 100 may include the display area DA and the component area CA in which the transmission portion TA is arranged. The inorganic insulating layer IL and the organic insulating layer 117 may be arranged on the substrate 100. The organic light-emitting diodes, that is, the main organic light-emitting diode OLEDm and the auxiliary organic light-emitting diode OLEDa, which are display elements, may be arranged on the organic insulating layer 117 and may include the pixel electrodes, that is, the first pixel electrode 121 and the second pixel electrode 121' and the opposite electrode 123. The pixel-defining layer 119 may cover the edges of the pixel electrodes, that is, the first pixel electrode 121 and the second pixel electrode 121' and define the emission areas of the organic light-emitting diodes, that is, the main organic light-emitting diode OLEDm and the auxiliary organic light-emitting diode OLEDa.

The inorganic insulating layer IL may include the insulating layer opening IL_OP corresponding to the transmission portion TA. The organic insulating layer 117 may include the first organic insulating layer 117a and the second organic insulating layer 117b. The first organic insulating layer 117a and the second organic insulating layer 117b may respectively include the first opening OP1 and the second opening OP2 corresponding to the transmission portion TA.

In this case, on the component area CA, the second organic insulating layer 117b may include the planarization area PA and the reduction area RA, the reduction area RA having a thickness that decreases in a direction from the planarization area PA to the second opening OP2. A portion of the pixel-defining layer 119 may be arranged on the reduction area RA.

According to some example embodiments, the substrate 100 of the display panel 10 may include a first base layer 100a, a first inorganic barrier layer 100b, a second base layer 100c, and a second inorganic barrier layer 100d. The first base layer 100a and the second base layer 100c may include the polymer resin described above. Each of the first inorganic barrier layer 100b and the second inorganic barrier layer 100d includes a barrier layer configured to prevent or reduce the penetration of impurities or contaminants from the outside and may include an inorganic material such as silicon oxide ($SiO_2$), silicon nitride ($SiN_x$), and silicon oxynitride (SiON) and have a single-layered structure or a multi-layered structure. In this case, according to some example embodiments, the bottom metal layer BML may be arranged between the second base layer 100c and the second inorganic barrier layer 100d.

Hereinafter, a method of manufacturing the display apparatus 1 is described in detail.

Figure 11:
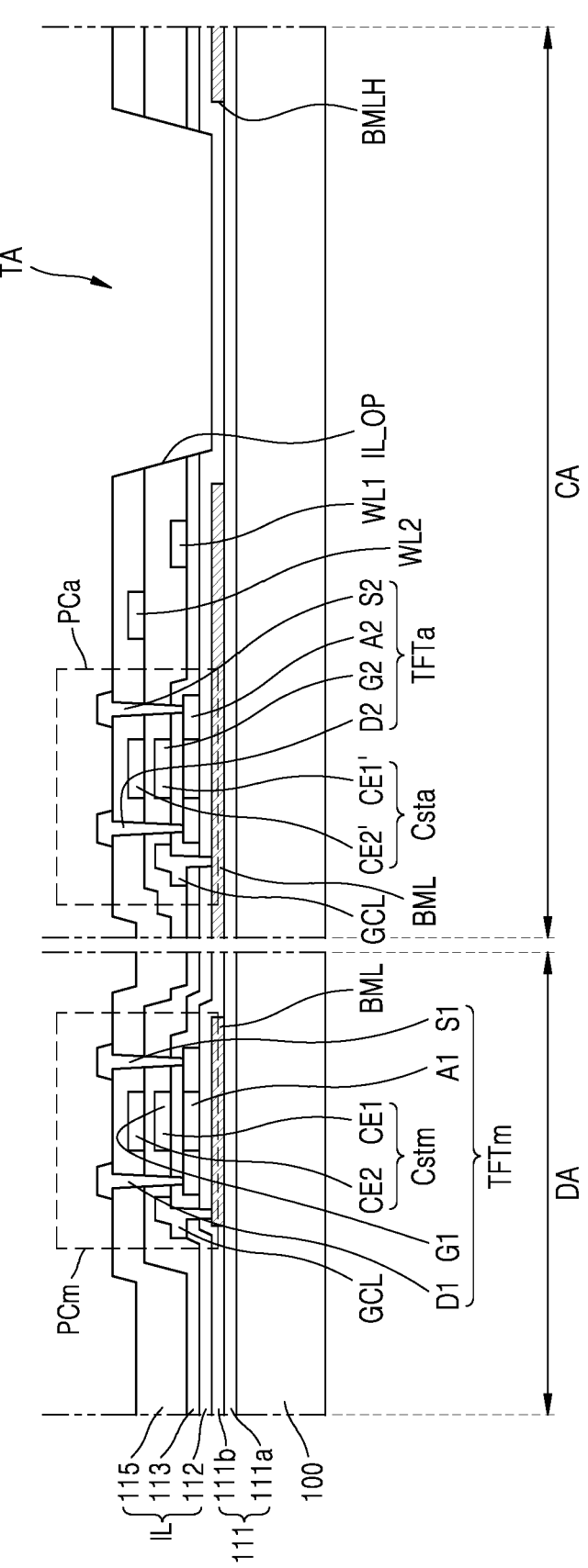
FIG. 11 is a cross-sectional view showing a method of manufacturing a display apparatus according to some example embodiments.
Figure 12A:
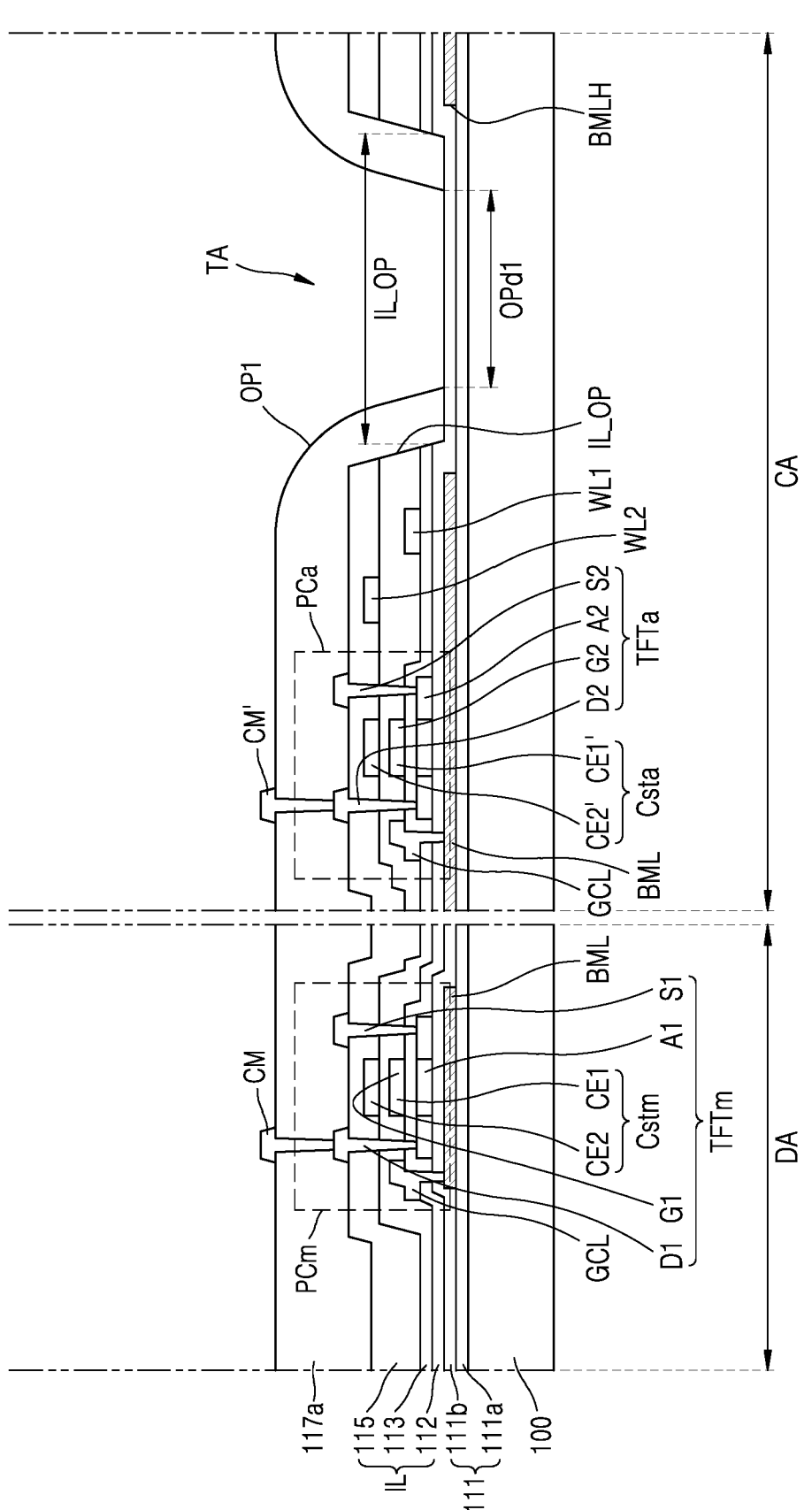
FIGS. 12A and 12B are cross-sectional views showing a method of manufacturing a display apparatus according to some example embodiments.
Figure 12B:
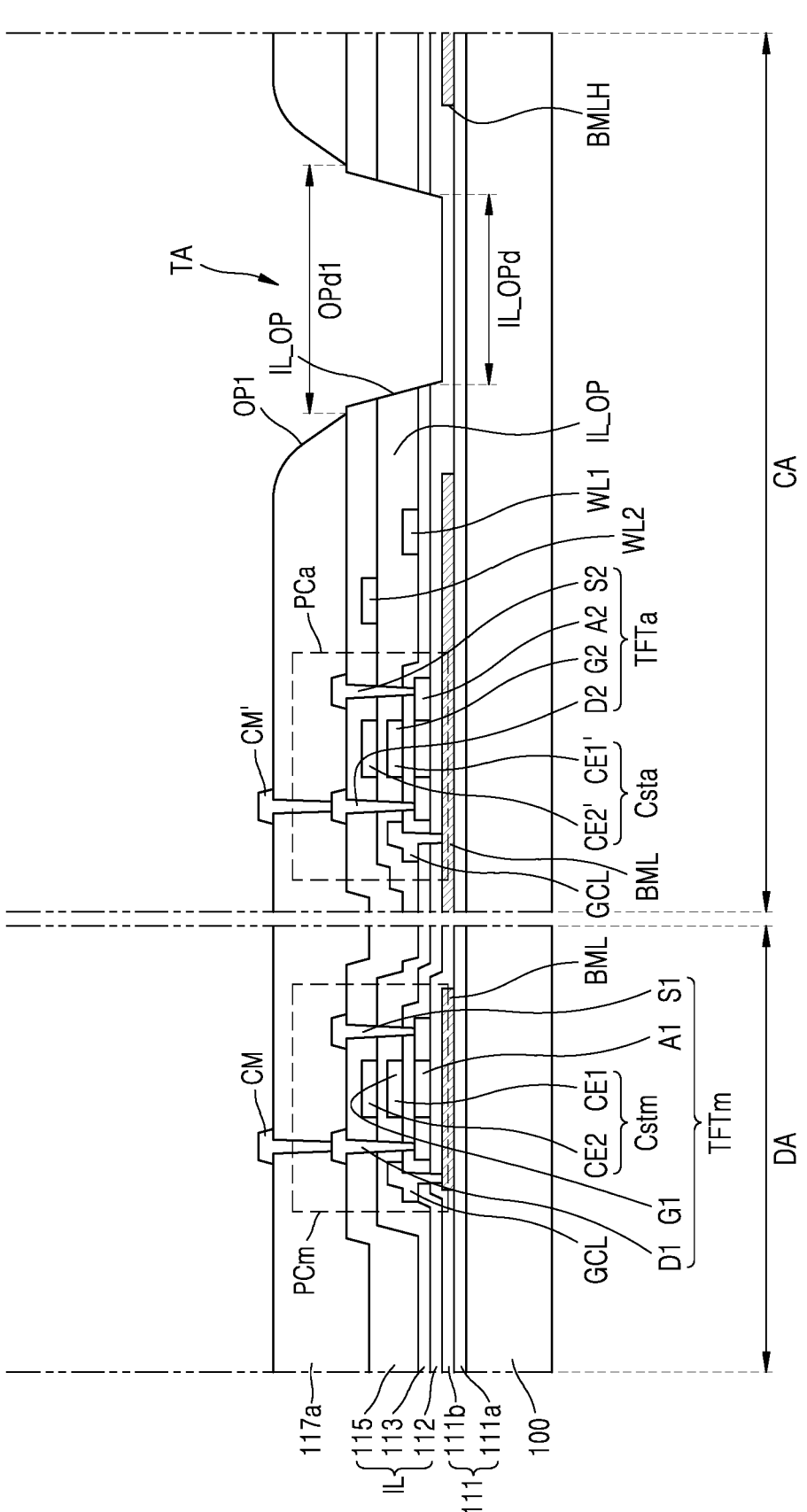

FIG. 11 is a cross-sectional view showing a method of manufacturing a display apparatus according to some example embodiments. FIGS. 12A and 12B are cross-sectional views showing a method of manufacturing a display apparatus according to some example embodiments. FIGS. 13 to 16 are cross-sectional views showing a method of manufacturing a display apparatus according to some example embodiments.

Referring to FIG. 11, the substrate 100 including the display area DA and the component area CA may be prepared, the main sub-pixel being arranged on the display area DA, and the auxiliary sub-pixel and the transmission portion TA being arranged on the component area CA. The main pixel circuit PCm and the auxiliary pixel circuit PCa may be formed over the substrate 100, the main pixel circuit PCm including the main thin film transistor TFTm and the main storage capacitor Cstm, and the auxiliary pixel circuit PCa including the auxiliary thin film transistor TFTa and the auxiliary storage capacitor Csta.

The inorganic insulating layer IL may be formed over the substrate 100. For example, the bottom metal layer BML arranged between the first buffer layer 111a and the second buffer layer 111b is formed and then the first gate insulating layer 112, the second gate insulating layer 113, and the interlayer insulating layer 115 may be sequentially formed.

The inorganic insulating layer IL may be formed by using chemical vapor deposition (CVD), atomic layer deposition (ALD), plasma enhanced chemical vapor deposition (PECVD), high density plasma-chemical vapor deposition (HDP-CVD), or vacuum deposition.

According to some example embodiments, the insulating layer opening IL_OP may be formed by removing a portion of the inorganic insulating layer IL, the insulating layer opening IL_OP corresponding to the transmission portion TA. Therefore, the inorganic insulating layer IL may include the insulating layer opening IL_OP corresponding to the transmission portion TA. The insulating layer opening IL_OP may include an opening of the first gate insulating layer 112, an opening of the second gate insulating layer 113, and an opening of the interlayer insulating layer 115 that overlap one another. The openings may be individually formed through separate processes or simultaneously formed through the same process.

According to some example embodiments, the inorganic insulating layer IL may not include the insulating layer opening IL_OP corresponding to the transmission portion TA and include an insulating layer groove corresponding to the transmission portion TA.

Referring to FIGS. 12A and 12B, the first organic insulating layer 117a may be formed on the inorganic insulating layer IL. The first organic insulating layer 117a may include an approximately flat top surface over the display area DA and a portion of the component area CA.

Next, the first opening OP1 may be formed by removing a portion of the first organic insulating layer 117a, the first opening OP1 corresponding to the transmission portion TA. Therefore, the first organic insulating layer 117a may include the first opening OP1 corresponding to the transmission portion TA. The first organic insulating layer 117a may include contact holes exposing a portion of the thin film transistors, that is, the main thin film transistor TFTm and the auxiliary thin film transistor TFTa. According to some example embodiments, while the first opening OP1 is formed, the contact holes may be simultaneously formed.

Next, the connection metals CM and CM' may be formed on the first organic insulating layer 117a. The connection metals CM and CM' may be respectively connected to the thin film transistors, that is, the main thin film transistor TFTm and the auxiliary thin film transistor TFTa.

Referring to FIG. 12A, the size OPd1 of the first opening OP1 may be less than the size IL_OPd of the insulating layer opening IL_OP. In this case, the first organic insulating layer 117a may cover the inner surface of the insulating layer opening IL_OP.

Referring to FIG. 12B, the size OPd1 of the first opening OP1 may be greater than the size IL_OPd of the insulating layer opening IL_OP. In this case, the first opening OP1 may expose a portion of the inorganic insulating layer IL. In addition, the first opening OP1 may expose a portion of the top surface of the inorganic insulating layer IL. However, for convenience of description, the case where the size OPd1 of the first opening OP1 is less than the size IL_OPd of the insulating layer opening IL_OP is mainly described in detail.

According to some example embodiments, the first organic insulating layer 117a may include the first opening OP1 corresponding to the transmission portion TA and accordingly, a portion of the first organic insulating layer 117a may not be flat.

Figure 13:
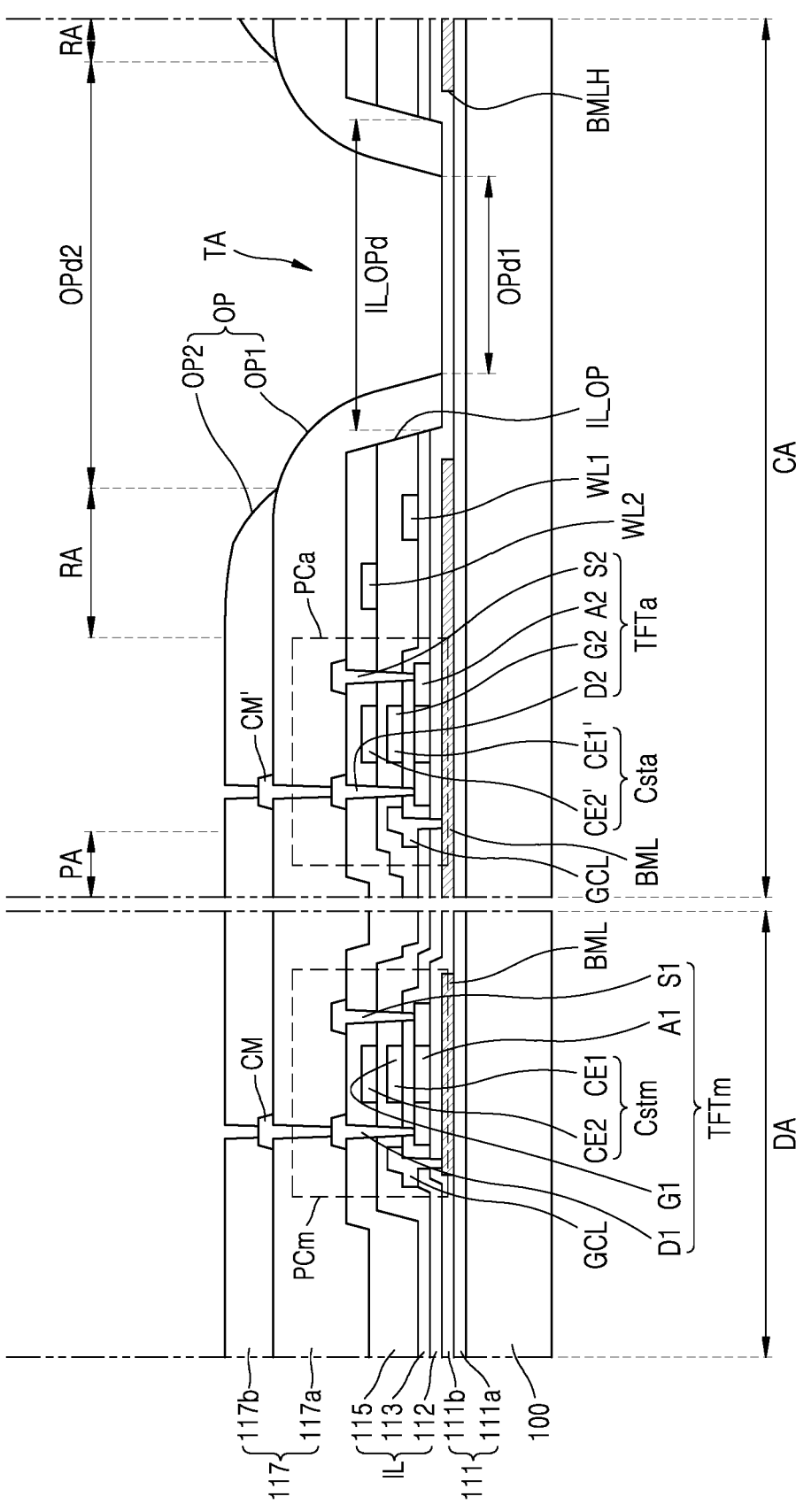
FIGS. 13 to 16 are cross-sectional views showing a method of manufacturing a display apparatus according to some example embodiments.

Referring to FIG. 13, the second organic insulating layer 117b may be formed on the first organic insulating layer 117a. The second organic insulating layer 117b may be formed to include an approximately flat top surface on the display area DA and a portion of the component area CA.

Next, the second opening OP2 may be formed by removing a portion of the second organic insulating layer 117b, the second opening OP2 corresponding to the transmission portion TA. Therefore, the second organic insulating layer 117b may include the second opening OP2 corresponding to the transmission portion TA. According to some example embodiments, the size OPd2 of the second opening OP2 may be greater than the size OPd1 of the first opening OP1. Therefore, the second opening OP2 may expose a portion of the first organic insulating layer 117a.

In addition, the second opening OP2 may include contact holes exposing a portion of the connection metals CM and CM'. According to some example embodiments, the contact holes may be simultaneously formed while the second opening OP2 is formed.

According to some example embodiments, the planarization area PA may be formed on the component area CA. The planarization area PA includes a region in which the top surface of the second organic insulating layer 117b is flat. In addition, the reduction area RA may be formed on the component area CA, the reduction area RA having a thickness that decreases in a direction from the planarization area PA to the second opening OP2. In the reduction area RA, the top surface of the second organic insulating layer 117b may not be flat. According to some example embodiments, the reduction area RA may be formed on the flat top surface of the first organic insulating layer 117a. Alternatively, the reduction area RA may be formed on the uneven top surface of the first organic insulating layer 117a. The reduction area RA may be formed due to the viscosity of a material of the second organic insulating layer 117b, the insulating layer opening IL_OP of the inorganic insulating layer IL, or the first opening OP1.

Figure 14:
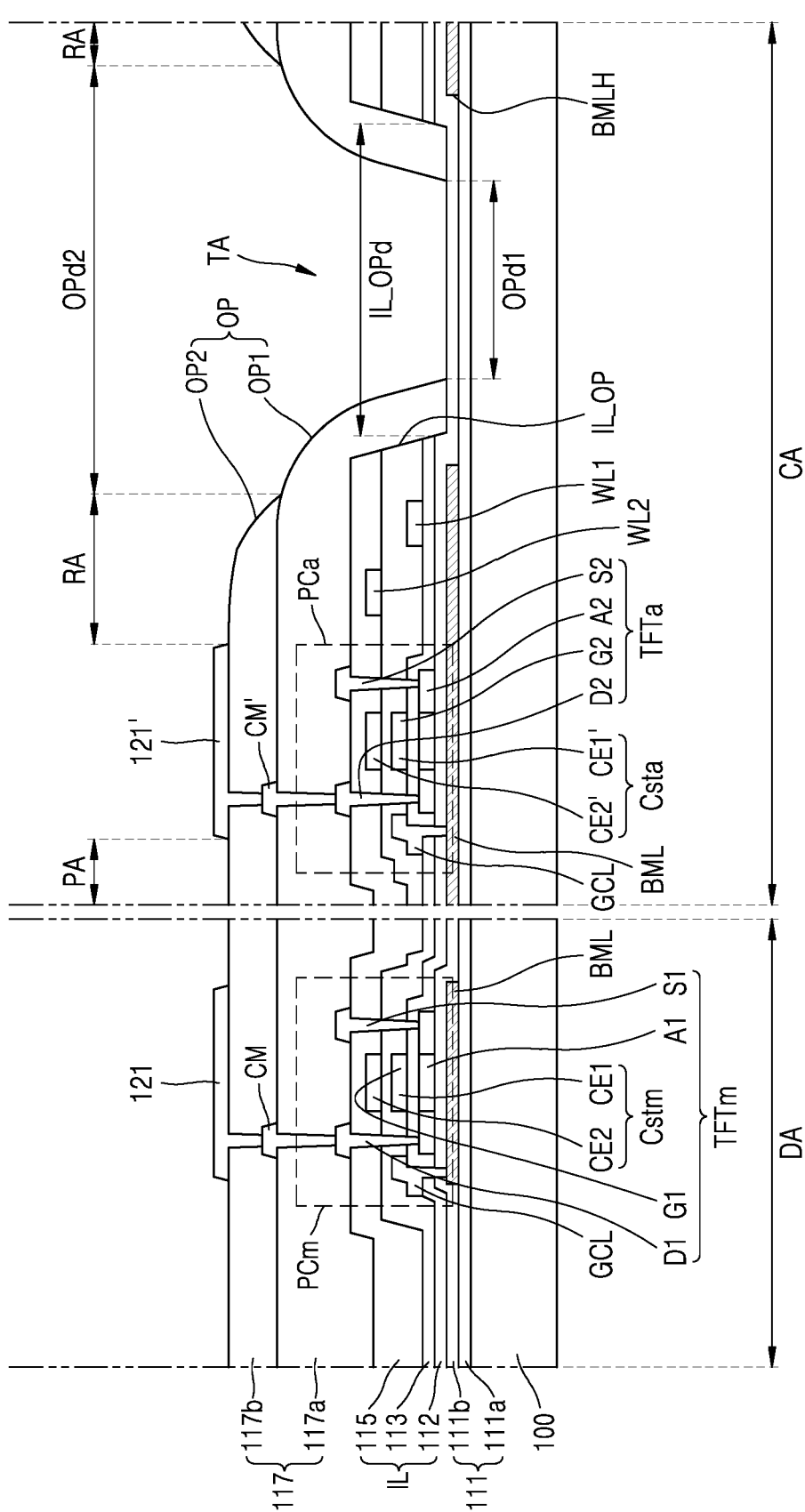

Referring to FIG. 14, the pixel electrodes, that is, the first pixel electrode 121 and the second pixel electrode 121' may be formed on the second organic insulating layer 117b. The pixel electrodes, that is, the first pixel electrode 121 and the second pixel electrode 121' may be respectively connected to the connection metals CM and CM' through contact holes of the second organic insulating layer 117b. The pixel electrodes, that is, the first pixel electrode 121 and the second pixel electrode 121' may be formed by forming a conductive layer through a deposition process and then performing a patterning process.

Figure 15:
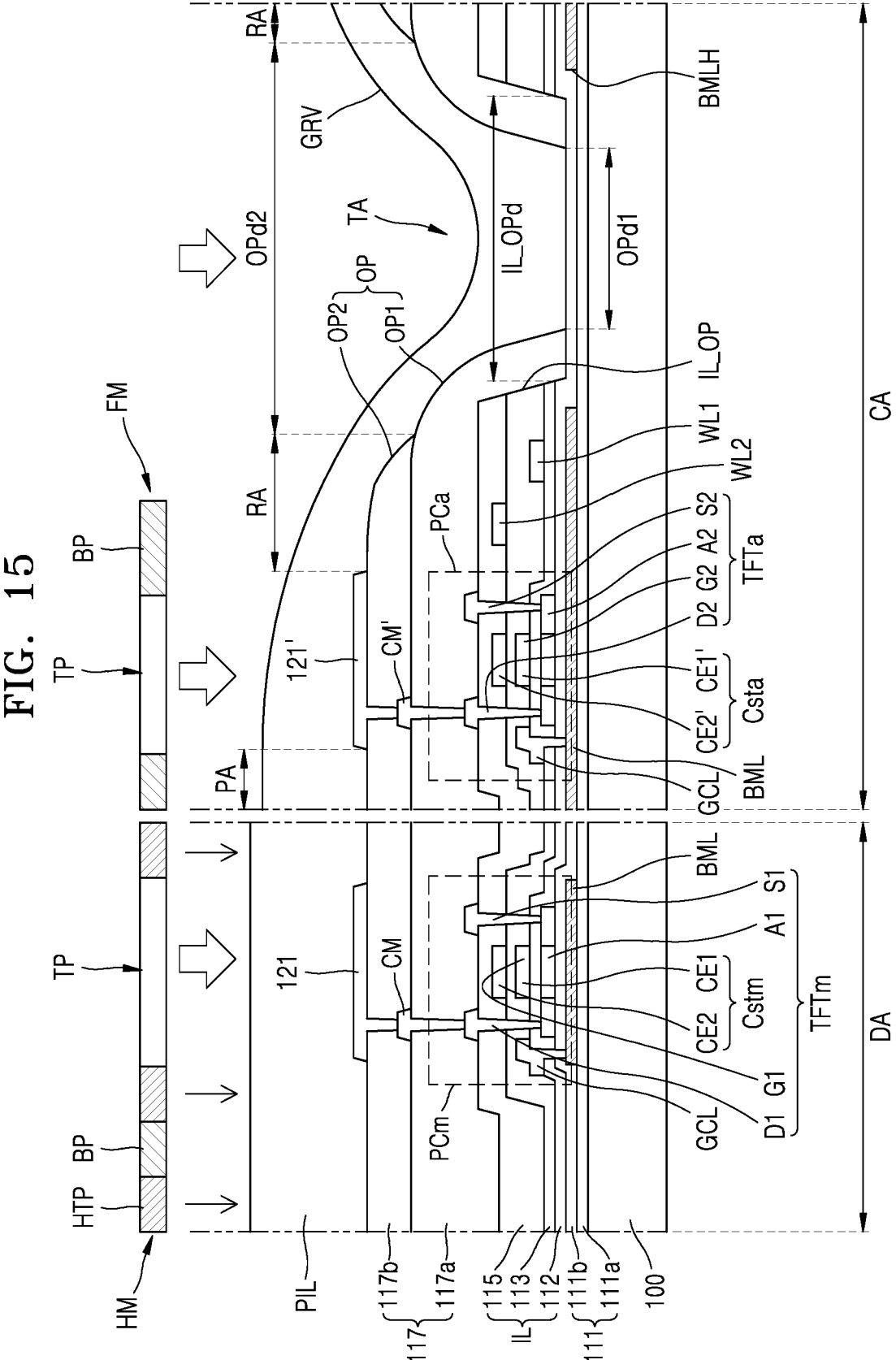
Figure 16:
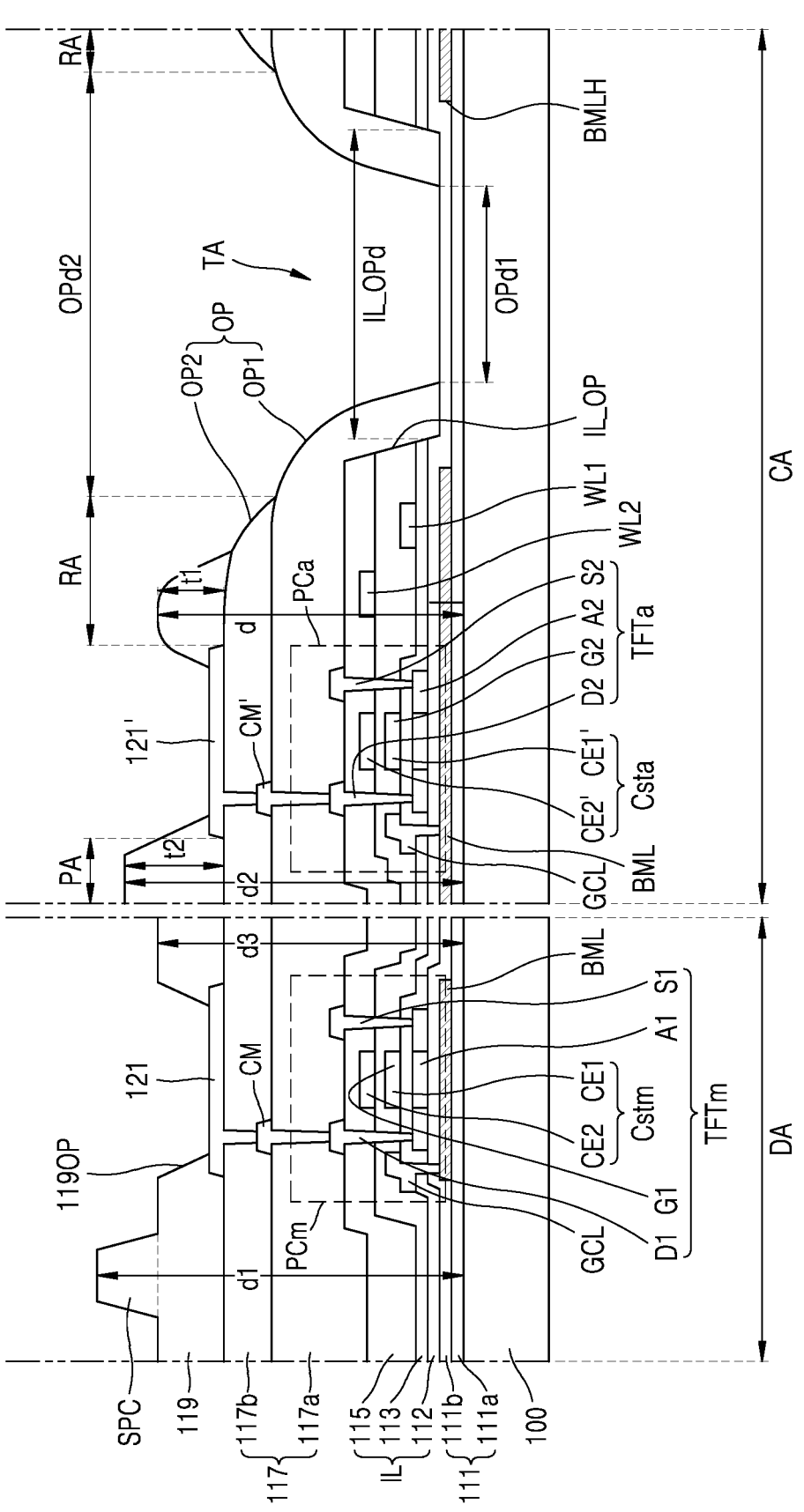

Referring to FIGS. 15 and 16, a preliminary insulating layer PIL may be formed on the display area DA and the component area CA. The preliminary insulating layer PIL may include an organic insulating material such as polyimide, polyamide, an acrylic resin, benzocyclobutene, HMDSO, and a phenolic resin.

The preliminary insulating layer PIL may include an approximately flat top surface on the display area DA. The preliminary insulating layer PIL may include an uneven top surface on the component area CA. For example, the preliminary insulating layer PIL may include a groove GRV on the component area CA. In this case, the groove GRV may correspond to the transmission portion TA. Because the insulating layer opening IL_OP, the first opening OP1, and the second opening OP2 each corresponding to the transmission portion TA are formed on the component area CA, even when the preliminary insulating layer PIL is formed on the component area CA, an overall flat top surface may not be formed.

Next, the half-tone mask HM may be arranged to correspond to the display area DA, and the full-tone mask FM may be arranged to correspond to the component area CA. According to some example embodiments, the half-tone mask HM may be different from the full-tone mask FM. According to some example embodiments, the half-tone mask HM may be connected to the full-tone mask FM.

The half-tone mask HM may include a light-transmissive portion TP, a half-transmissive portion HTP, and a light-blocking portion BP. The light-transmissive portion TP may transmit most of light. The half-transmissive portion HTP may transmit a portion of light. Therefore, an amount of light exposure may be adjusted by using the half-transmissive portion HTP. The light-blocking portion BP may shield most of light.

The full-tone mask FM may include the light-transmissive portion TP and the light-blocking portion BP. The light-transmissive portion TP may pass most of light, and the light-blocking portion BP may shield most of light.

Next, the preliminary insulating layer PIL may be exposed and a portion of the preliminary insulating layer PIL may be removed through a developing process. Therefore, the pixel-defining layer 119 and the spacer SPC may be formed on the display area DA, and the pixel-defining layer 119 may be formed on the component area CA.

In this case, the spacer SPC may be formed on a region of the display area DA that corresponds to the light-blocking portion BP of the half-tone mask HM. The pixel-defining layer 119 may be formed on a region of the display area DA that corresponds to the half-transmissive portion HTP of the half-tone mask HM. The preliminary insulating layer PIL may be removed from a region of the display area DA that corresponds to the light-transmissive portion TP of the half-tone mask HM and accordingly, a main opening 119OPm may be formed, the main opening 119OPm exposing the central portion of the first pixel electrode 121.

The pixel-defining layer 119 may be formed on a region of the component area CA that corresponds to the light-blocking portion BP of the full-tone mask FM, and the preliminary insulating layer PIL on a region of the component area CA that corresponds to the light-transmissive portion TP of the full-tone mask FM is removed. Accordingly, the auxiliary opening 119OPa may be formed, the auxiliary opening 119OPa exposing the central portion of the second pixel electrode 121'. Therefore, the spacer SPC on the display area DA may be simultaneously formed with the pixel-defining layer 110 on the component area CA.

According to some example embodiments, a portion of the pixel-defining layer 119 on the component area CA may be formed on the reduction area RA, and a portion of the pixel-defining layer 119 may be formed on the planarization area PA. In this case, the pixel-defining layer 119 may cover the edges of the second pixel electrodes 121' and define an emission area of the organic light-emitting diode.

The first thickness t1 of the pixel-defining layer 119 arranged on the reduction area RA may be less than the second thickness t2 of the pixel-defining layer 119 arranged on the planarization area PA. This is because, while the pixel-defining layer 119 in the reduction RA is hardened, a reflow occurs in a direction to the second opening OP2. Therefore, the first thickness t1 may be less than the second thickness t2.

According to some example embodiments, the first distance d1 from the top surface 100US of the substrate 100 to the top surface of the spacer SPC may be greater than the second distance d2 from the top surface 100US of the substrate 100 to a top surface of the pixel-defining layer 119 arranged on the planarization area PA. The second distance d2 may be greater than the third distance d3 from the top surface 100US of the substrate 100 to the top surface of the pixel-defining layer 119 arranged on the display area DA. In addition, the distance d from the top surface 100US of the substrate 100 to the top surface of the pixel-defining layer 119 arranged on the reduction area RA may be less than the second distance d2 from the top surface 100US of the substrate 100 to a top surface of the pixel-defining layer 119 arranged on the planarization area PA. According to some example embodiments, the distance d from the top surface 100US of the substrate 100 to the top surface of the pixel-defining layer 119 arranged on the reduction area RA may be the same as the third distance d3 from the top surface 100US of the substrate 100 to the top surface of the pixel-defining layer 119 arranged on the display area DA.

According to some example embodiments, even though the full-tone mask FM is used on the component area CA, the second distance d2 may be less than the first distance d1. This is because the transmission portion TA is arranged on the component area CA, and each of the inorganic insulating layer IL, the first organic insulating layer 117a, the second organic insulating layer 117b, and the pixel-defining layer 119 may include an opening corresponding to the transmission portion TA.

In this case, when the pixel-defining layer and the spacer are formed also on the component area CA by using the half-tone mask HM, the pixel-defining layer 119 on the component area CA may not clearly define an emission area of the auxiliary organic light-emitting diode. Therefore, because the emission area of the auxiliary organic light-emitting diode is not defined, blurring of light emitted from the auxiliary organic light-emitting diode may occur. That is, the auxiliary organic light-emitting diode may emit light in an undesired region.

According to some example embodiments, because the pixel-defining layer 119 may be formed on the component area CA by using the full-tone mask FM, not the half-tone mask HM, the pixel-defining layer 119 having an appropriate thickness may be formed on the component area CA. Therefore, the emission area of the auxiliary organic light-emitting diode may be clearly defined and accordingly, blurring of light emitted from the auxiliary organic light-emitting diode may be prevented or reduced.

In addition, because the pixel-defining layer 119 is formed on the component area CA by using the full-tone mask FM, the pixel-defining layer 119 on the planarization area PA may serve as the spacer SPC on the display area DA. Therefore, in the case of performing a process that uses a mask, the damage to the auxiliary organic light-emitting diode may be prevented or reduced.

As described above, in the embodiments, a portion of the pixel-defining layer may be arranged at an appropriate thickness even on the reduction area. Therefore, the pixel-defining layer may clearly define the emission area of the organic light-emitting diode.

In addition, in the embodiments, because the organic insulating layer includes an opening corresponding to the transmission portion, a high transmittance may be secured in the component area.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims and their equivalents.

What is claimed is:

1. A display device comprising:
   a substrate including a display area and a component area including a transmission area;
   an organic insulating layer on a first surface of the substrate and including a first opening corresponding to the transmission area;
   a protection member on a second surface of the substrate opposite to the first surface and including a second opening overlapping the transmission area;
   a component disposed in the second opening;
   a main sub-pixel including a first pixel electrode disposed on the organic insulating layer corresponding to the display area; and
   an auxiliary sub-pixel including a second pixel electrode disposed on the organic insulating layer corresponding to the component area;
   a pixel-defining layer covering an edge of the first pixel electrode and an edge of the second pixel electrode; and
   a spacer disposed on the pixel-defining layer corresponding to the display area,
   wherein the organic insulating layer includes a first area overlapping with the first pixel electrode, a planarization area overlapping with a portion of the second pixel electrode, and a reduction area that overlaps with a different portion of the second pixel electrode and is disposed between the planarization area and the first opening, the reduction area having a thickness that decreases in a direction from the planarization area to the first opening, wherein the different portion of the second pixel electrode close to the first opening is covered by the pixel-defining layer having a first maximum thickness, the portion of the second pixel electrode distant from the first opening is covered by the pixel-defining layer having a second maximum thickness, an edge of the first pixel electrode is covered by the pixel-defining layer having a third maximum thickness, and the second maximum thickness is greater than the first maximum thickness and the third maximum thickness.

2. The display device of claim 1,
   wherein a first distance from a top surface of the substrate to a top surface of the spacer is greater than a second distance from the top surface of the substrate to a top surface of the pixel-defining layer on the planarization area.

3. The display device of claim 2, wherein the second distance is greater than a third distance from the top surface of the substrate to a top surface of the pixel-defining layer on the display area.

4. The display device of claim 2, wherein the spacer and the pixel-defining layer include the same material.

5. The display device of claim 1, further comprising an inorganic insulating layer between the substrate and the organic insulating layer,
   wherein the inorganic insulating layer includes an insulating layer opening corresponding to the transmission area.

6. The display device of claim 5, wherein the organic insulating layer includes a first organic insulating layer and a second organic insulating layer, the first organic insulating layer being on the inorganic insulating layer, and the second organic insulating layer being on a first inorganic insulating layer,
   wherein the first organic insulating layer includes a third opening corresponding to the transmission area.

7. The display device of claim 6, wherein a size of the third opening is less than a size of the insulating layer opening, and
   the first organic insulating layer covers an inner surface of the insulating layer opening.

8. The display device of claim 6, wherein a size of the third opening is greater than a size of the insulating layer opening, and
   the third opening exposes a portion of the inorganic insulating layer.

9. The display device of claim 1, further comprising another auxiliary sub-pixel disposed on the organic insulating layer corresponding to the component area,
   wherein one of the auxiliary sub-pixels has a quadrangular shape in a plan view and
   another of the auxiliary sub-pixels has a pentagonal shape in a plan view.

10. The display device of claim 1, wherein the first maximum thickness is the same as the third maximum thickness.

11. The display device of claim 1, further comparing a bottom metal layer on the component area,
    wherein the bottom metal layer is disposed between the substrate and the auxiliary sub-pixel and has a hole corresponding to the transmission area.

12. The display device of claim 1, wherein a first distance from a top surface of the substrate to a top surface of the spacer is greater than a second distance from the top surface of the substrate to a top surface of the pixel-defining layer on the planarization area, and wherein the second distance is greater than a third distance from the top surface of the substrate to a top surface of the pixel-defining layer on the display area.

13. The display device of claim 1, wherein a first distance from a top surface of the substrate to a top surface of the spacer is greater than a second distance from the top surface of the substrate to a top surface of the pixel-defining layer on the planarization area, and wherein the second distance is greater than a third distance from the top surface of the substrate to a top surface of the pixel-defining layer on the reduction area.

\* \* \* \* \*